United States Patent [19]

Hamuro et al.

[11] Patent Number: 5,547,511
[45] Date of Patent: Aug. 20, 1996

[54] ELECTRODE FORMING SYSTEM FOR CHIP COMPONENTS

[75] Inventors: Mitsuro Hamuro; Hirokazu Higuchi; Tadahiro Nakagawa; Akihiko Takahashi, all of Nagaokakyo, Japan

[73] Assignee: Murata Manufacturing Co., Ltd., Japan

[21] Appl. No.: 162,680

[22] Filed: Dec. 6, 1993

[30] Foreign Application Priority Data

Dec. 4, 1992 [JP] Japan ................... 4-350563

[51] Int. Cl.⁶ ....................................... B05C 3/00
[52] U.S. Cl. ................. 118/423; 118/500; 414/935; 414/940
[58] Field of Search ............... 414/744.3, 744.4, 414/417, 940, 935, 404, 737, 752; 118/423, 500, 503; 901/40

[56] References Cited

U.S. PATENT DOCUMENTS

| | | | |
|---|---|---|---|
| 4,141,458 | 2/1979 | Brooks et al. | 414/935 |
| 4,395,184 | 7/1983 | Braden | 414/417 |
| 4,664,943 | 3/1987 | Nitta et al. | |
| 4,669,416 | 6/1987 | Delgado et al. | 118/503 |
| 4,788,931 | 12/1988 | Nitta et al. | |
| 4,808,059 | 2/1989 | Eddy | 414/744.4 |
| 4,847,991 | 7/1989 | Higuchi | |
| 4,859,498 | 8/1989 | Yamaguchi | |
| 4,903,393 | 2/1990 | Higuchi | |
| 4,926,789 | 5/1990 | Wenger et al. | 118/58 |
| 5,167,326 | 12/1992 | Murphy | 206/331 |
| 5,248,340 | 9/1993 | Nakagawa et al. | 118/503 |
| 5,339,537 | 8/1994 | Kuster | 34/612 |

FOREIGN PATENT DOCUMENTS

| | | |
|---|---|---|
| 0344404 | 7/1991 | Japan. |
| 2151159 | 7/1985 | United Kingdom. |
| 2152854 | 8/1985 | United Kingdom. |
| 2169923 | 7/1986 | United Kingdom. |
| 2212818 | 8/1989 | United Kingdom. |

Primary Examiner—Brenda A. Lamb
Attorney, Agent, or Firm—Ostrolenk, Faber, Gerb & Soffen, LLP

[57] ABSTRACT

An electrode forming system automatically carries out overall steps of charging chip components, coating electrode material on both ends of the components and discharging the components using a holding plate, a guide plate and a spacer. This system comprises a charger, a transferer, an electrode coater, a drying furnace, a holding plate standby means, a spacer storage means, a holding plate storage means, a discharger, a transport robot, conveyor means and a control unit. Movements of these apparatus are integratedly controlled by the control unit. The robot transports the holding plate, the guide plate or the spacer among these apparatus arranged within its working area.

26 Claims, 16 Drawing Sheets

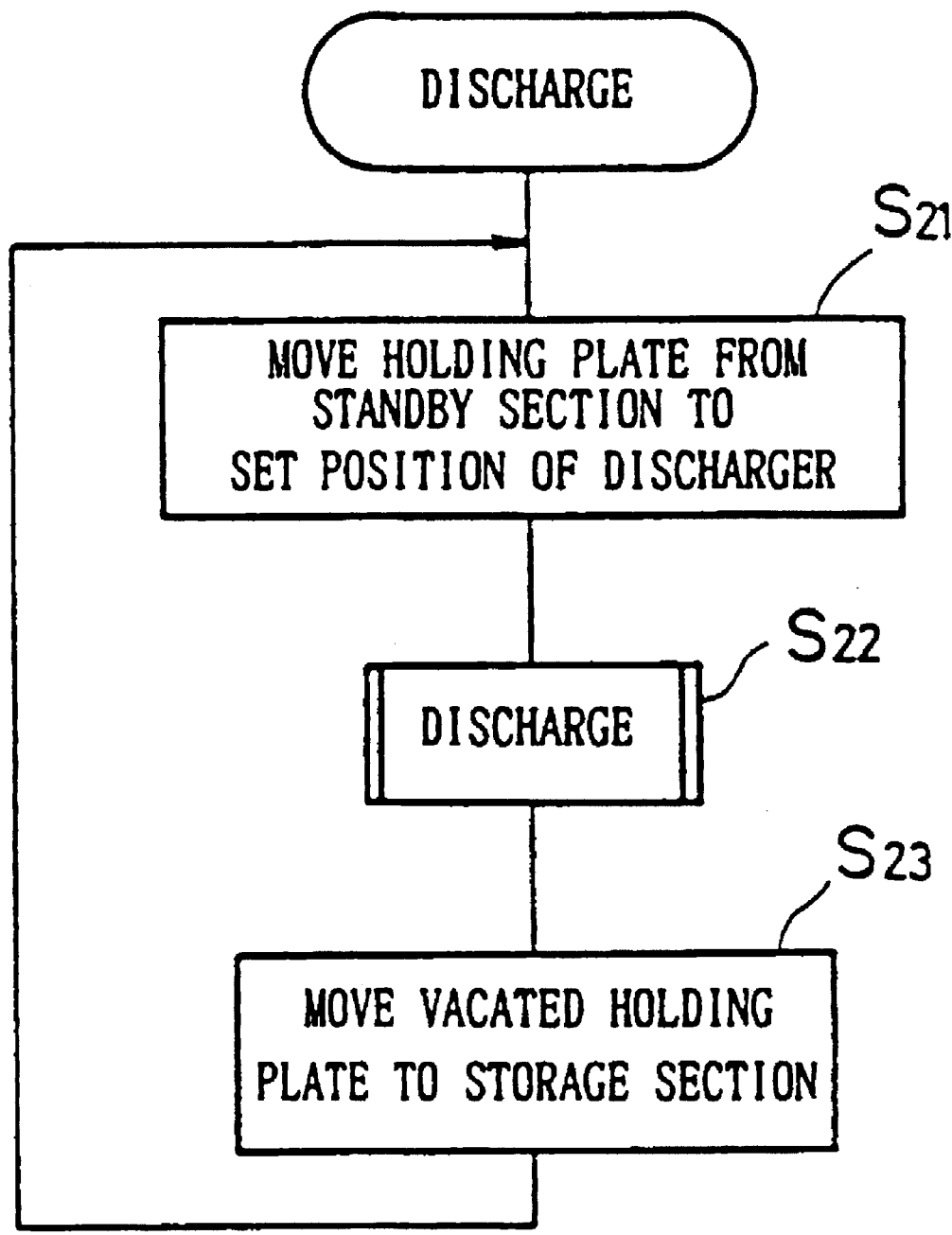

ELECTRODE FORMING SYSTEM FOR CHIP COMPONENTS

BACKGROUND OF THE INVENTION

The present invention relates to a system for forming external electrodes on end portions of chip components such as chip capacitors or chip resistors.

U.S. Pat. No. 4,395,184 discloses an exemplary method of forming electrodes on end portions of chip components.

First, a holding plate and a guide plate which is superposed thereon are set in a charger, so that chip components are inserted in holes provided in the guide plate by vibration or vacuum suction. Bottom surfaces of the holes provided in the guide plate are covered with the holding plate. Then, the holding plate and the guide plate are integrally taken out from the charger, and the chip components inserted in the holes of the guide plate are pushed into receiving holes of the holding plate by a punch mechanism. The holding plate has a number of such receiving holes for resiliently holding the chip components. The holding plate, thus holding the chip components upwardly projecting on its upper surface, is placed on a conveyor and passed under an electrode material coating station, so that the projecting portions of the components are coated with electrode material. The holding plate is then carried by the conveyor to a heating station, so that the electrode material is dried therein. Thereafter the holding plate is carried to the punch mechanism again, so that the components are pushed down from the upper side to a lower side of the holding plate. Then the holding plate is inverted and again placed on the conveyor to be carried to the coating station and the heating station, so that the chip components are again coated with the electrode material and dried. The components thus provided with electrodes on both end portions are again set in the punch mechanism, and discharged into holes of an unloading plate from the holding plate.

In the aforementioned electrode forming method, various types of plates must be set in and detached from the punch mechanism in various combinations in the respective operations for charging, pushing and discharging the chip components.

SUMMARY OF THE INVENTION

Accordingly, an object of the present invention is to provide an electrode forming system for chip components, which can automate all steps from a charging step to a discharging step, thereby improving productivity.

Another object of the present invention is to provide an electrode forming system for chip components, which can attain a high degree of efficiency with relatively a small number of holding plates.

The electrode forming system according to the present invention uses first and second holding plates having a number of receiving holes for resiliently holding said chip components, a guide plate having a number of guide holes corresponding to the receiving holes, and a spacer for defining a clearance between said first and second holding plates so as to carry out the following operations. First, the components are fed by charge means into the guide holes of the guide plate. Next, the components received in the guide holes of the guide plate are transferred into the receiving holes of the first holding plate by transfer means to exposed one ends of the components. The transfer means has a number of press pins corresponding to the receiving holes so as to push the components. Then, the first holding plate holding the components is carried to electrode coating means by conveyor means. When the components are thus carried to the coating means, one ends of the components are coated with electrode material. The coating means may preferably chuck the first holding plate horizontally with the components downwardly exposed therebelow, and press the exposed ends of the components against a horizontal surface supplied with electrode material in the form of a thin film. The first holding plate holding the components, whose one ends are thus coated with the electrode material, is carried into drying means by the conveyor means, so that the electrode material is dried therein. Thereafter, the first holding plate is carried to holding plate standby means by the conveyor means, and further carried to the transfer means by transport means. At this time, the transfer means transfers the components from the first holding plate into the second holding plate through the spacer to expose the other ends of the components. Then, the second holding plate having received the components is carried to the electrode coating means to apply the electrode material onto the exposed ends of the components, and further carried to the drying means.

The second holding plate holding the chip components, which are provided with electrodes on both ends, is carried from the drying means to the standby means by the conveyor means and next to discharge means by the transport means. The discharge means has a number of press pins similarly to the transfer means, and discharges the components from the second holding plate.

In addition to the aforementioned charge means, transfer means and holding plate standby means, spacer storage means for storing the spacer and holding plate storage means for holding a certain number of the holding plates are preferably arranged within a working area of the transport means. The transport means transports the holding plate, the guide plate or the spacer among these means in prescribed order. Since the transport means need not work in a large area, it is possible to reduce the working space and the carriage period.

In general, after chip components projecting from one surface of a holding plate are coated with electrodes, the components are passed through receiving holes to project from the other surface of the holding plate. At this time, the electrode surfaces of the components are easily damaged due to high resistance, and a large force being applied to the holding plate. According to the present invention, after the components exposed from one surface of the first holding plate are coated with electrodes on one ends thereof, the components are transferred from the first holding plate to the second holding plate so that electrodes are formed on the other ends thereof, whereby it is not necessary to pass the components through the receiving holes. Thus, the aforementioned defects can be solved.

When the transfer means has upwardly directed press pins, the guide plate is preferably provided with guide holes each of which has a large diameter portion to receive a component, and a small diameter portion to be passed through by the press pin. The large diameter portion opens at an upper surface of the guide plate and has a cross-sectional size sufficiently large to receive one of the components C. And the small diameter portion extends from the bottom of the large diameter portion to an lower surface of the guide plate and has a cross-sectional size smaller than a cross-sectional size of the component. In this case, only the guide plate may be set in the charge means without setting the holding plate, whereby the charging step is simplified.

When the press pins upwardly push the components from the guide plate to the holding plate, the components are held on a lower surface of the holding plate. Thus, it is not necessary to invert the holding plate in advance of electrode coating step.

The aforementioned spacer is preferably formed by a frame-like body, whose thickness is smaller than the length of the chip component, having an opening which is larger than a holes-distributed range of the holding plate.

The drying means may preferably be a drying furnace comprising a rotator which radially supports a plurality of holding plates at constant angles and which intermittently rotate upon a horizontal axis at the constant angles. The furnace also preferably comprises an inlet opening and an outlet opening which are provided in 180° symmetrical positions. In this case, it is possible to continuously dry a plurality of holding plates while successively inserting the holding plates into the drying furnace. As a result, drying process can be efficiently carried out without long waiting time, unlike the case of bach processing. Further, when the aforementioned 180° rotation system is employed, a moving mechanism in the drying furnace is simplified. Moreover, when a holding plate holding the components on its lower surface is introduced into the inlet opening of this drying furnace, the holding plate is discharged from the outlet opening holding the components on its upper surface. Thus, it is easy to check the result of electrode formation of the components, and there is no need to invert the holding plate in order to transfer the components to another holding plate.

When the transport means simply moves among the charge means, the transfer means, the discharge means, the holding plate standby means, the spacer storage means and the holding plate storage means, which are arranged within a certain range, it is possible reduce both space for operation and time loss. Further, while one means is in operation, the transport means can continuously move among other means. Thus a high degree of efficiency is attained.

A robot which swings within a certain range may preferably employed as a transport means, since it is able to accurately set jigs into correct positions in the respective means as well as to reduce the working period.

The conveyor means may preferably be prepared from the one which support only both side portions of the holding plate so that the conveyor means would not interfere with the chip components exposed from the lower surface of the holding plate. For example, it can be prepared from a pair of belt conveyors, a table feeding mechanism having a servo motor and a ball screw, a table carrying mechanism having a pneumatic or hydraulic cylinder and the like.

When a number of holding plates are used in rotation for the step of forming electrodes on one ends of the components, on the other ends thereof, and discharging the components, electrode formation can be efficiently carried out with a small number of holding plates.

According to the present invention, as hereinabove described, all steps of charging, transferring, electrode coating on one end, drying, transferring, electrode coating on the other end, drying and discharging can be free from manual operation, whereby productivity can be improved.

Further, the chip components which are held on one holding plate and coated with electrode materials on one ends thereof are thereafter transferred to another holding plate so that the other ends thereof are in turn coated with electrode materials. Since the components need not to be passed through the receiving holes, a small pushing force is enough for pushing the components into the receiving holes of the holding plate.

In addition, positions for introducing and discharging the jigs into and from the charge means, the transfer means and the discharge means and the position for storing the jigs are arranged in a working area of a single transport means. Thus it is possible to efficiently carry out complicated operations for carrying and exchanging the jigs.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a flow chart showing an operation for discharging the chip components.

DESCRIPTION OF THE PREFERRED EMBODIMENTS

Figure 1:
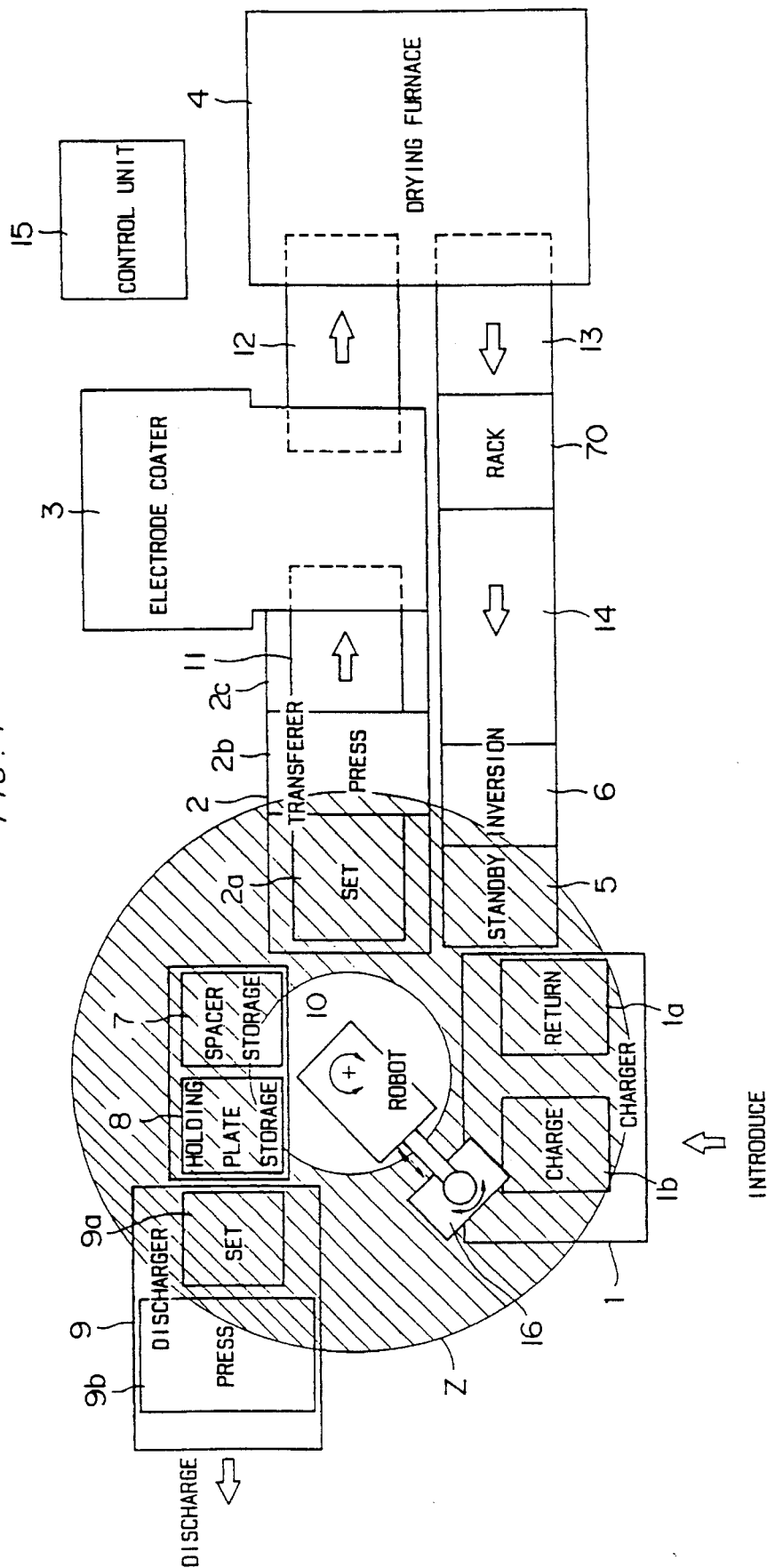
FIG. 1 is a plan view schematically showing an electrode forming system according to the present invention.

FIG. 1 is a general view showing an electrode forming system for chip components according to an embodiment of the present invention. This system is substantially formed by a charger 1, a transferer 2, an electrode coater 3, a drying furnace 4, a holding plate standby section 5, an inversion conveyor 6, a spacer storage section 7, a holding plate storage section 8, a discharger 9, a transport robot 10, first to fourth conveyors 11 to 14, and a control unit 15 for integratedly controlling movements of the respective apparatus.

Figure 2:
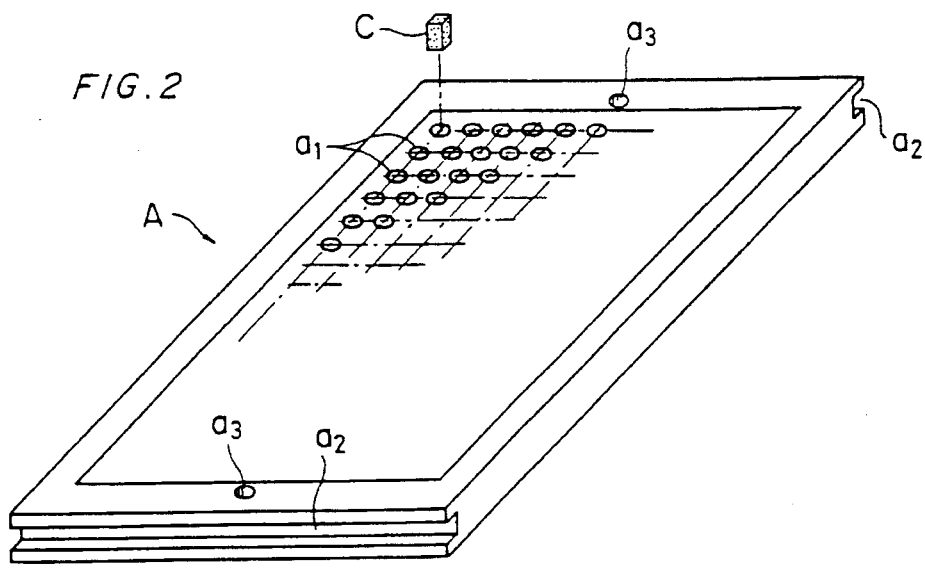
FIG. 2 is a perspective view showing a holding plate.
Figure 3:
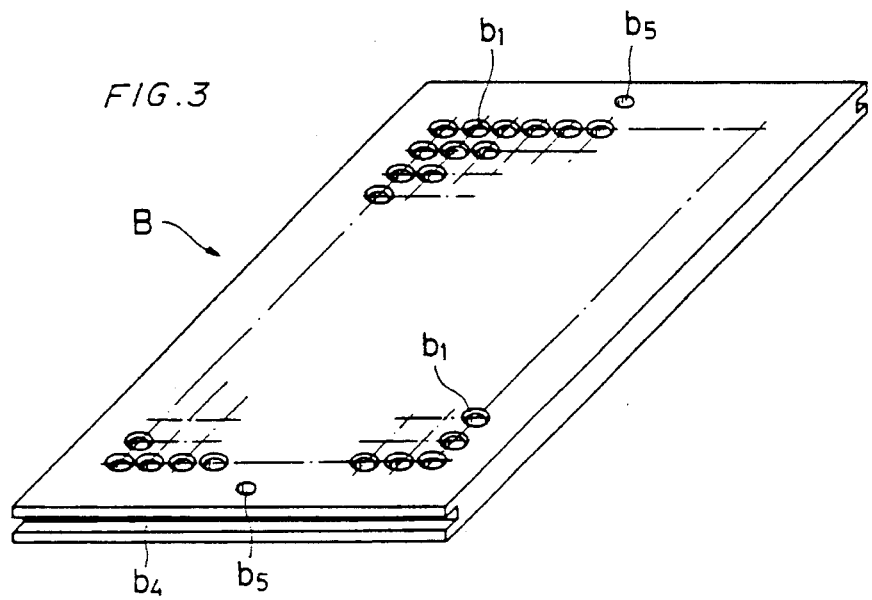
FIG. 3 is a perspective view showing a guide plate.
Figure 4:
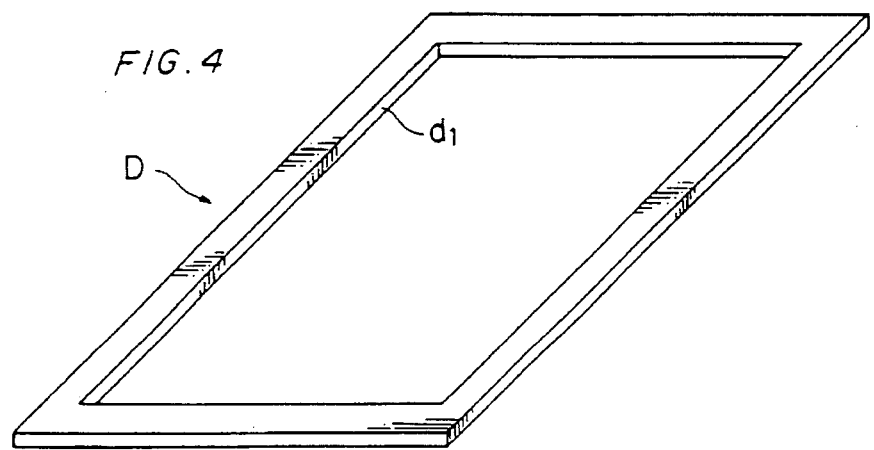
FIG. 4 is a perspective view showing a spacer plate.
Figure 7:
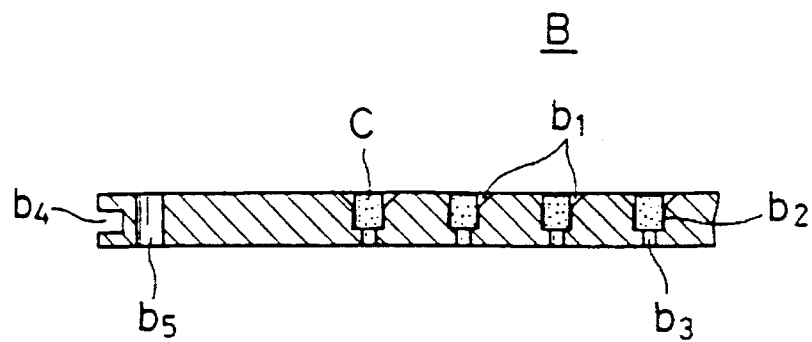
FIG. 7 is a sectional view showing a guide plate receiving chip components.

This system repeatedly uses holding plates A, guide plates B and a spacer plate D. The holding plate A shown in FIG. 2 has a number of receiving holes $a_1$ formed as through holes for resiliently holding chip components C, grooves $a_2$ formed on shorter side surfaces thereof, and pin holes $a_3$ formed close to the shorter sides thereof. The guide plate B shown in FIG. 3 has guide holes $b_1$ corresponding to the receiving holes $a_1$. Each of these guide holes $b_1$, as shown in FIG. 7, has a large diameter portion $b_2$ opening at the upper surface of the guide plate B and having a cross-sectional size sufficiently large to receive one of the components C, and a small diameter portion $b_3$ extending from the bottom of the large diameter portion $b_2$ to the lower surface of the guide plate B and having a cross-sectional size smaller than the cross-sectional size of the component C. Also, the guide plate B has grooves $b_4$ formed on shorter side surfaces thereof, and pin holes $b_5$ corresponding to the pin holes $a_3$. Further, the spacer plate D shown in FIG. 4 is in the form of a rectangular frame having an opening $d_1$ which is larger than the area of holding plate A encompassing the plurality of receiving holes $a_1$. The outlines of those jigs A, B and D are identical to each other.

In this embodiment, 25 holding plates A for one lot, two guide plates B and a single spacer plate D are used.

Figure 5:
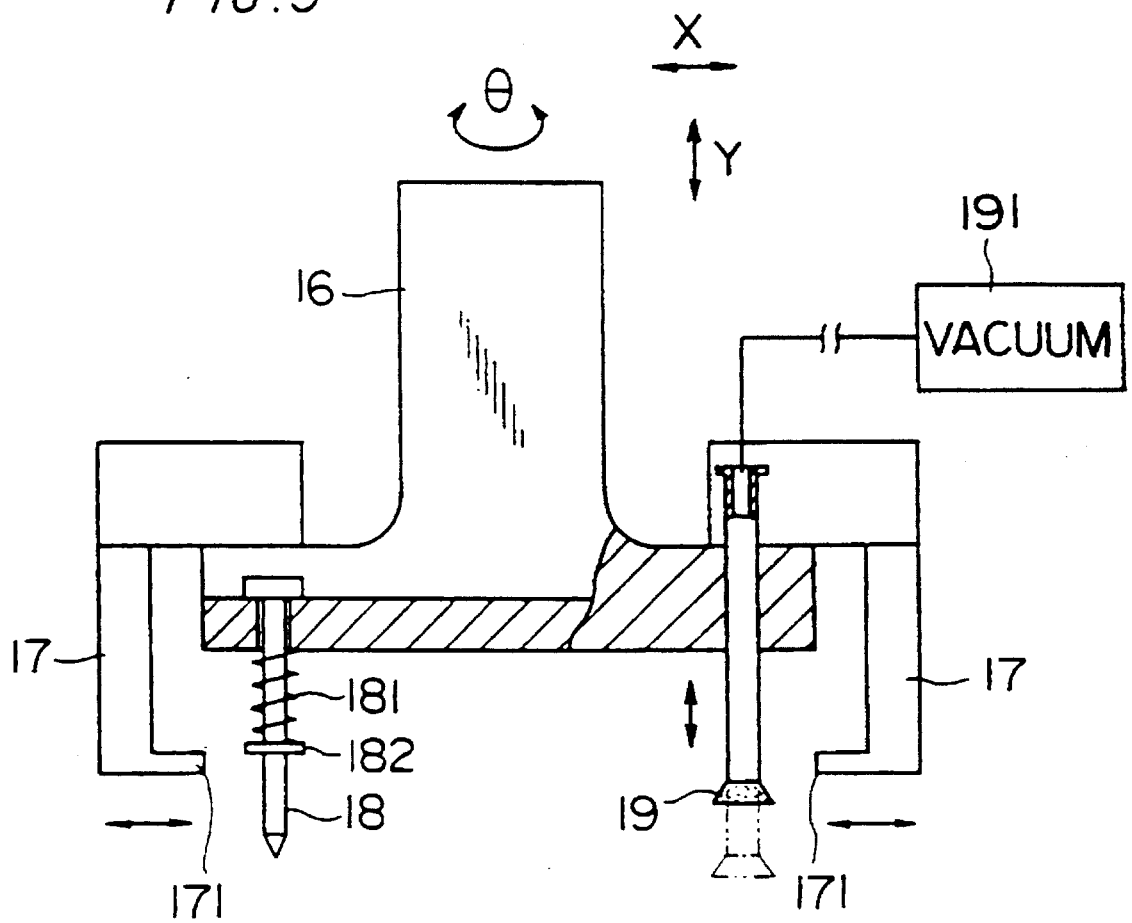
FIG. 5 is a partially fragmented side elevational view showing a hand of a transport robot.

As shown in FIG. 1, a return position 1a and a charge position 1b of the charger 1, a set position 2a of the transferer 2, the holding plate standby section 5, the spacer storage section 7, the holding plate storage section 8 and a set position 9a of the discharger 9 are arranged within a working area Z of a hand 16 of the transport robot 10. As shown in FIG. 5, the robot 10 is prepared from a horizontal turning robot, for example, and its hand 16 is movable along directions X, Y and θ. The hand 16 is provided on both side portions with a pair of sidewardly movable chucking pawls 17 having forward ends 171. When these pawls 17 are moved inwardly, the ends 171 are able to engage with the grooves $a_2$ of the holding plate A and the grooves $b_4$ of the guide plate B. The hand 16 is further provided close to both side portions thereof with a pair of vertically movable locating pins 18 which are downwardly urged by springs 181, and to which flanges 182 are fixed. When the hand 16 handles the holding plate A, these pins 18 are first inserted in pin holes $a_3$ of the holding plate A, and the flanges 182 come into press contact with the upper surface of the plate A, and then the chucking pawls 17 are inwardly moved so that the forward ends 171 thereof are engaged with the grooves $a_2$. In the same way, the guide plate B are also handled by the hand 16. Thus, the hand 16 can handle the holding plate A or the guide plate B in an accurate position. The hand 16 is further provided close to both side portions thereof with suction pads 19, which are connected to vacuum suction unit 191. These suction pads 19 are able to handle the spacer plate D when the pads 19 are downwardly moved to the position lower than the lowermost ends of the pins 18, as shown by two-dot chain lines in FIG. 5. However, the spacer D may be able to be handled by the pawls 17 and pins 18 in place of the pads 19 when pin holes which correspond to the pin holes $a_3$ are formed on the spacer D.

Figure 6:
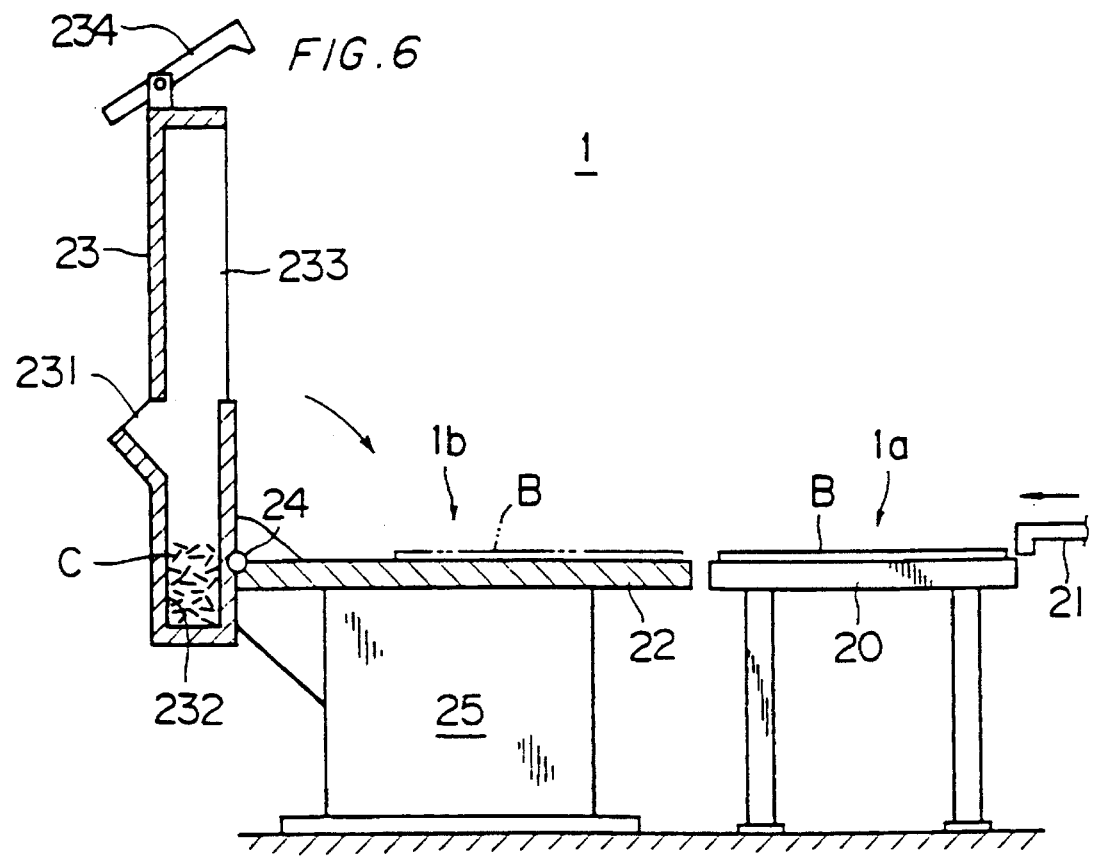
FIG. 6 is a sectional view showing a charger.

The charger 1 is adapted to automatically charge the components C into the guide holes $b_1$ of the guide plate B,
and has the return position 1a and the charge position 1b for the guide plate B. As shown in FIG. 6, a stand 20 is provided on the return position 1a so that the guide plate B placed on this stand 20 can be pushed toward the charge position 1b by a pusher 21. The charge position 1b is provided with a charge table 22, which is flush with the stand 20, for receiving the guide plate B pushed by the pusher 21. The charge table 22 is provided with a lid 23 which is rotatably moved around a horizontal axis 24. The lid 23 has an inlet opening 231, a chip box 232 for receiving a number of the components C and an outlet opening 233 which can be closed by the guide plate B. The lid 23 also has a hook 234 so as to keep the outlet opening 233 closed by the guide plate B. The charge table 22 is provided on a charging body 25 having a vibrator, a swinging means, a sucking means, a drive means to rotate the lid 23 around the axis 24, and the like (not shown). After a guide plate B is received on the table 22, the lid 23 is rotated downward on the guide plate B so that the components C are supplied thereon. Then the charging body 25 operates so that the components C are charged into the respective guide holes $b_1$ of the guide plate B one by one, as shown in FIG. 7.

Figure 8:
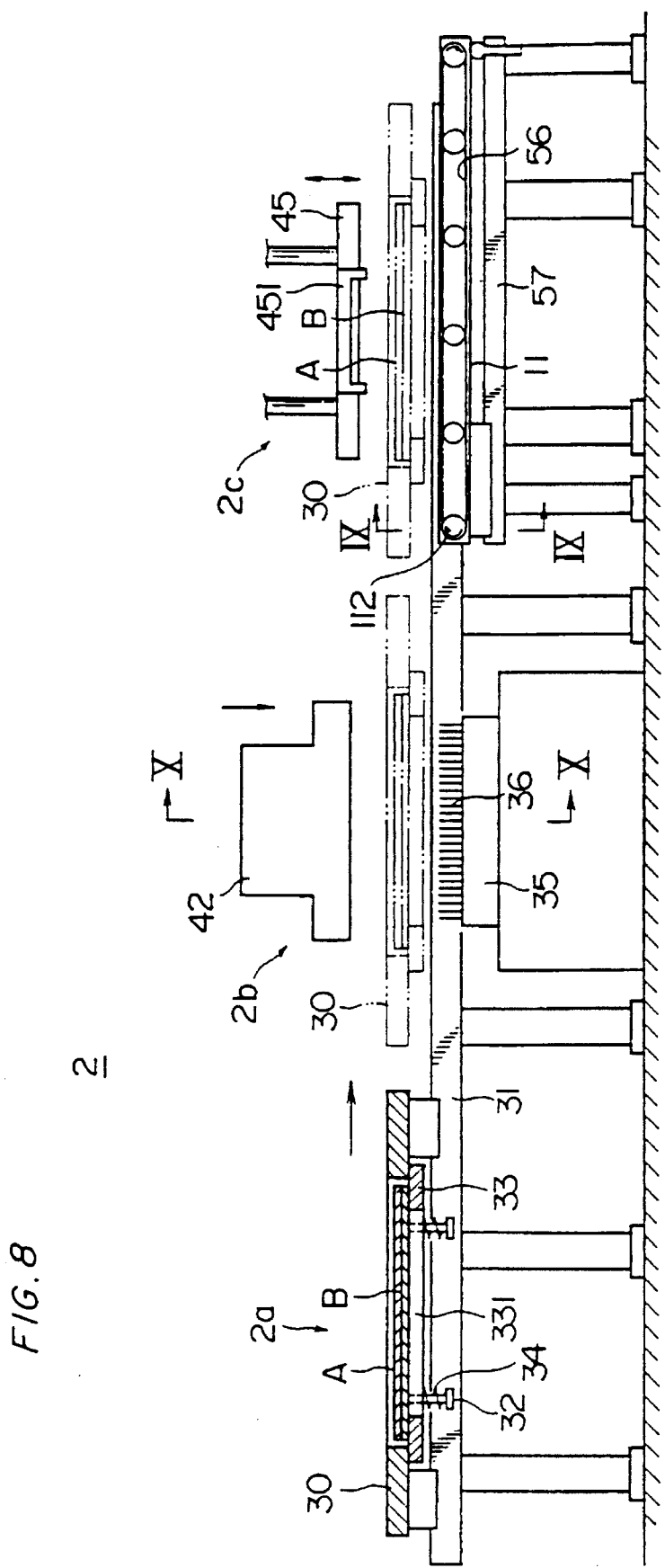
FIG. 8 is a side elevational view of a transferer.

As shown in FIG. 8, the transferer 4 has three portions including the jig set position 2a, a press position 2b and a release position 2c toward the electrode coater 3. This transferer 2 is adapted to automatically transfer the components C, which are charged in the guide holes $b_1$ of the guide plate B, into the receiving holes $a_1$ of the holding plate A and to transfer the components C thus held by the holding plate A into another holding plate A'. The transferer 2 is provided with a frame-type table 30 supported by a guide rail 31 so as to be horizontally movable in FIG. 8. A support frame 33, which is slidably guided by guide shafts 32, is vertically movable under the table 30 and is upwardly urged by springs 34 toward the lower surface of the table 30. This support frame 33 is provided in its center with an opening 331 which is smaller than the outline of each holding plate A and larger than a stripper plate 39 of a pin head 35 described later. The holding plate A and the guide plate B are accurately located on a prescribed position of the support frame 33 by locating means (not shown).

Figure 10A:
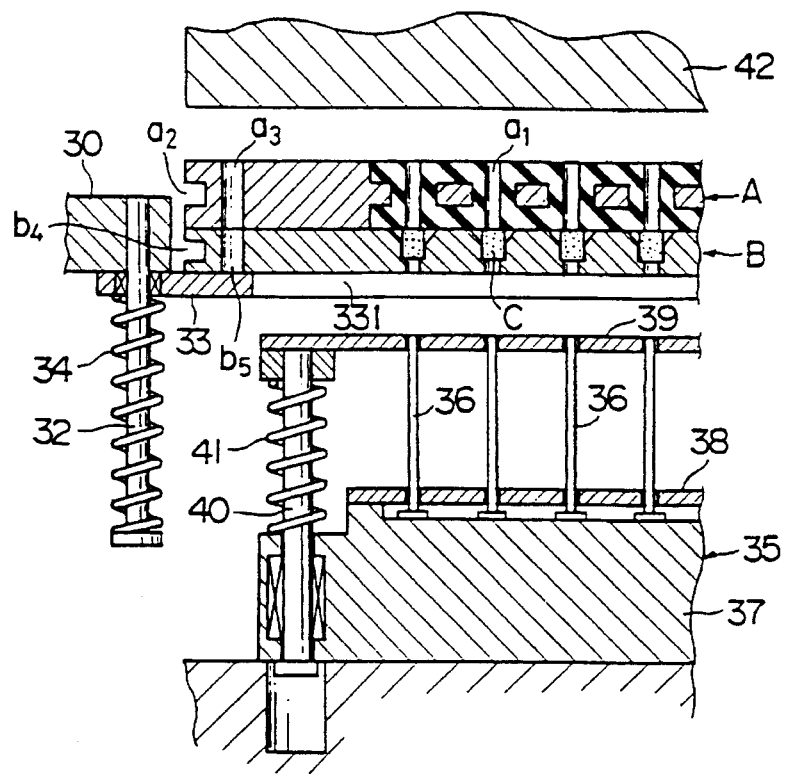
FIG. 10A is a sectional view taken along the line X—X in FIG. 8, showing the transferer before it inserts chip components from the guide plate to a holding plate.

The pin head 35 is horizontally fixed at the press position 2b. As shown in FIG. 10A, the pin head 35 is provided with flanged press pins 36 which are uprightly supported, a pressure receiving plate 37 which supports lower ends of the press pins 36, and a pin plate 38 which is fixed to an upper surface of the pressure receiving plate 37 to prevent the press pins 36 from displacement. The pin head 35 is further provided with a stripper plate 39 which guides upper portions of the press pins 36, guide shafts 40 which support the stripper plate 39, and springs 41 which upwardly urge the stripper plate 39. The press pins 36 are arranged at the positions corresponding to the positions of the receiving holes $a_1$ of the holding plate A. A vertically movable backing plate 42 is arranged above the pin head 35.

Figure 10B:
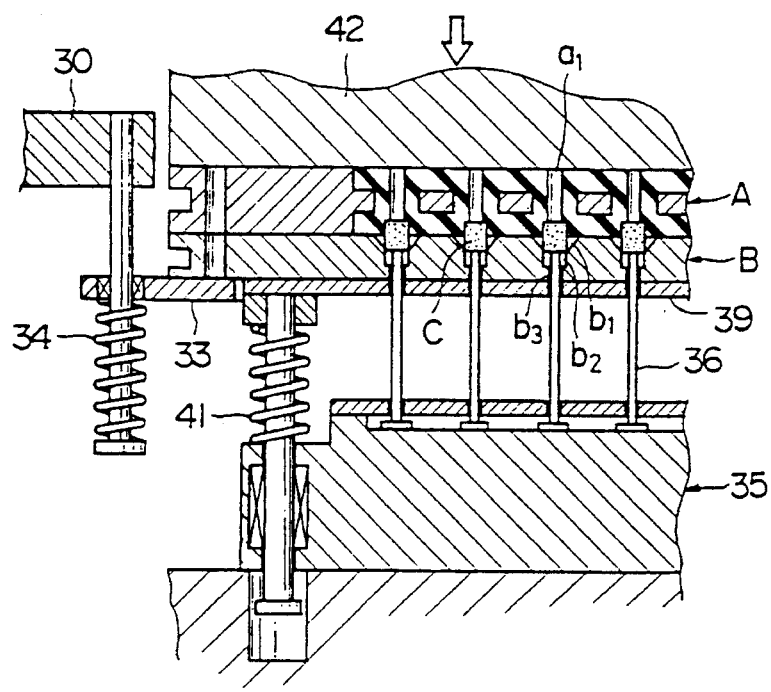
FIG. 10B is a sectional view taken along the line X—X in FIG. 8, showing the transferer when it inserts chip components from the guide plate to the holding plate.

An operation of the transferer 2 for inserting the components C from the guide plate B into the holding plate A is now described with reference to FIGS. 10A and 10B.

First, when the table 30 is at the jig set position 2a, the guide plate B and the holding plate A are superposed on the support frame 33 by the robot 10. Next, the table 30 is moved to the press position 2b so that the backing plate 42 is located above the holding plate A and the press pins 36 are located under the guide plate B, as shown in FIG. 10A. The backing plate 42 is then downwardly moved to push the upper surface of the holding plate A, thereby downwardly moving the holding plate A and the guide plate B integrally with the support frame 33. Then, the lower surface of the guide plate B comes into pressure contact with the upper surface of the stripper plate 39, and the press pins 36 go through the small diameter portions $b_3$ to enter the large diameter portions $b_2$ of the guide plate B. As a result, the pins 36 push the components C so that the upper portions of the components C are held by the receiving holes $a_1$ of the holding plate A (see FIG. 10B). Thereafter, the backing plate 42 is upwardly moved so that the support frame 33, the plates A and B, and the stripper plate 39 are integrally moved up by repulsion of the springs 34 and 41. Thus, the press pins 36 are extracted from the guide plate B and the stripper plate 39 is separated from the guide plate B. After the support frame 33 comes into contact with the table 30, the backing plate 42 is separated from the holding plate A, to return to the position shown in FIG. 10A. Thereafter, the table 30 is moved to the release position 2c.

As shown in FIG. 8, a chucking means 45 is provided above the release position 2c, to chuck and move up only the holding plate A. When chucking pawls 451 of the chucking means 45 are engaged with the grooves $a_2$ of the holding plate A, it is possible to reliably chuck the plate A. The guide plate B which is left on the support frame 33 is returned to the jig set position 2a together with the table 30. Thereafter, the chucking means 45 is downwardly moved to place the holding plate A on the first conveyor 11 provided therebelow. The first conveyor 11 carries the holding plate A to a next step, i.e., the electrode coater 3.

Figure 11A:
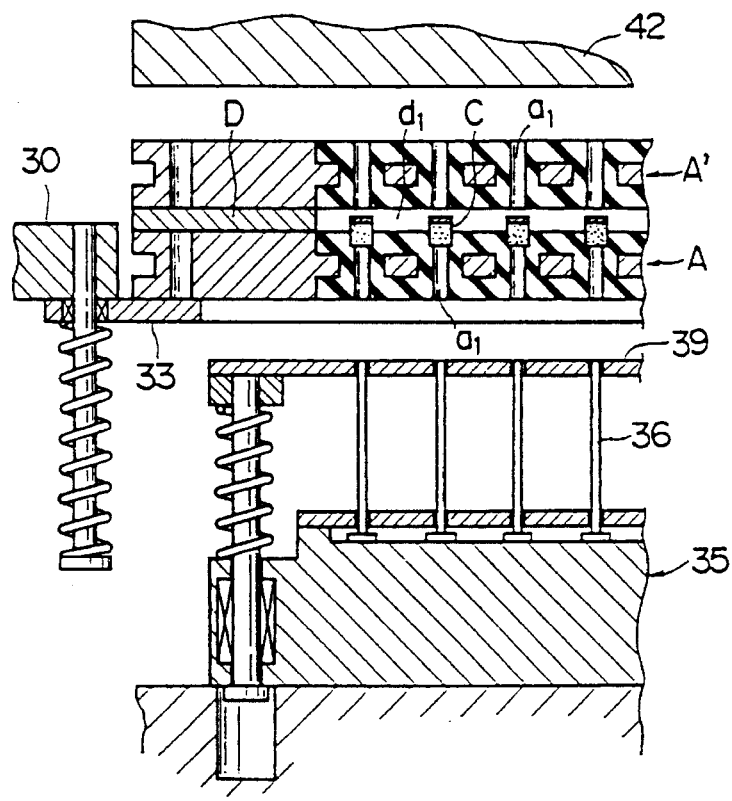
FIG. 11A is a sectional view taken along the line X—X in FIG. 8, showing the transferer before it transfers chip components from the holding plate to another holding plate.
Figure 11B:
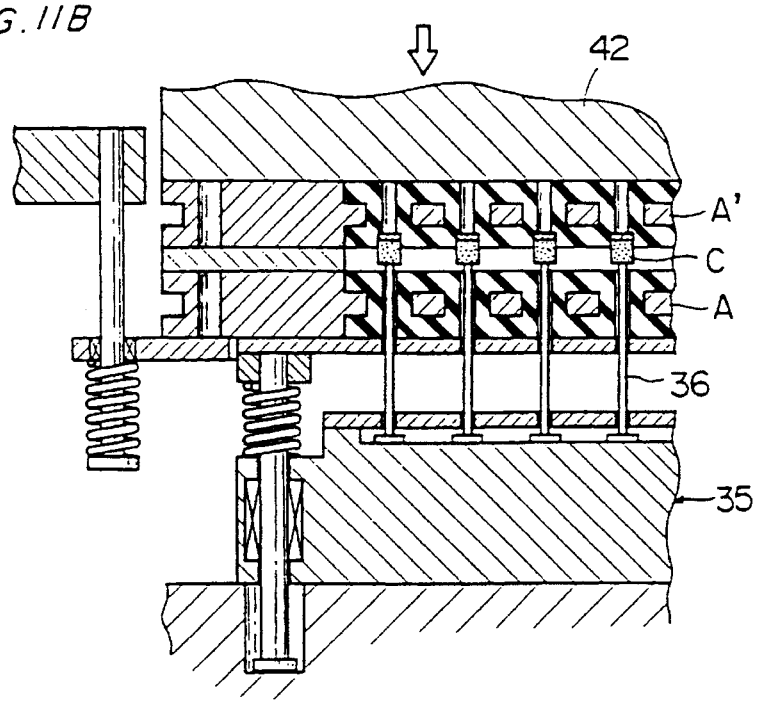
FIG. 11B is a sectional view taken along the line X—X in FIG. 8, showing the transferer when it transfers chip components from the holding plate to another holding plate.

Though the operation for inserting the components C from the guide plate B into the holding plate A has been described with reference to FIGS. 10A and 10B, the transferer 2 is also employed for transferring the components C from the holding plate A to another holding plate A', as shown in FIGS. 11A and 11B. FIG. 11A shows the holding plate A with components C and another holding plate A' before such transfer takes place, and FIG. 11B shows those plates when the components C are transferred. In this case, first the holding plate A with the components C exposed upwardly on its upper surface is placed on the support frame 33. Next, the frame-type spacer D is carried from the spacer storage section 7 and is superposed on the holding plate A. Then, the holding plate A' is carried from the holding plate storage section 8 and is superposed on the spacer D. The above described jigs A, A' and D are all carried by the robot 10.

Figure 9:
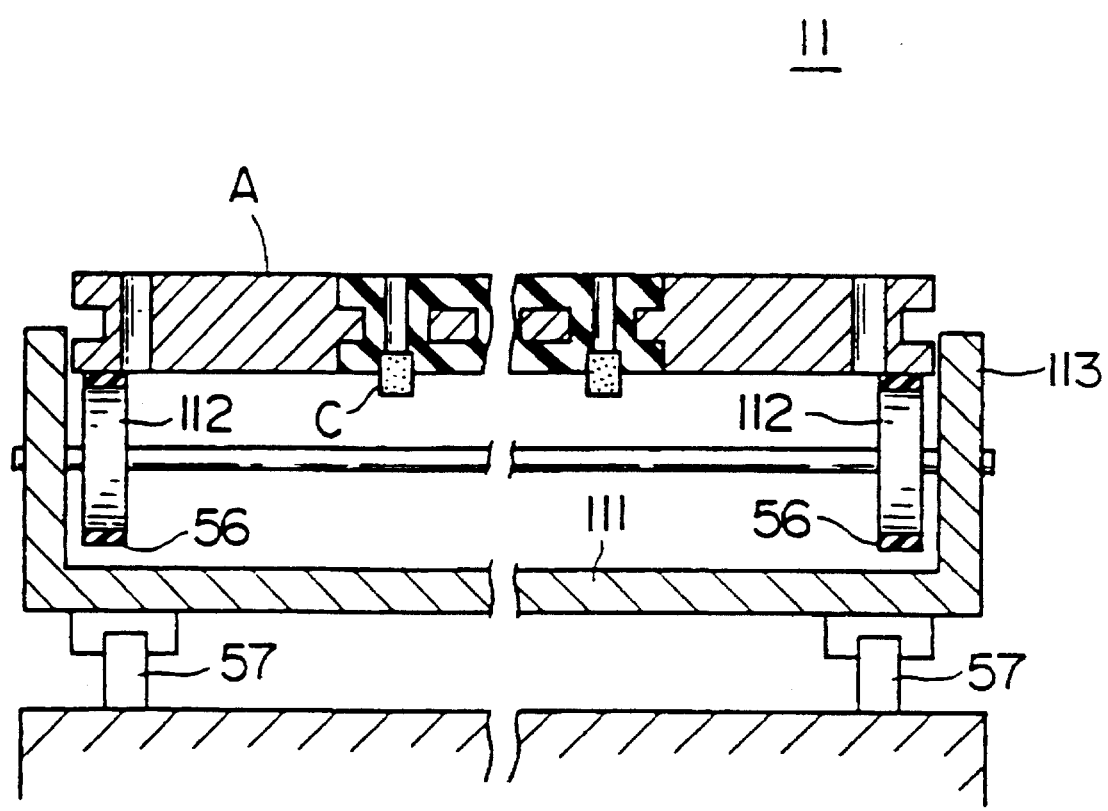
FIG. 9 is a sectional view taken along the line IX—IX in FIG. 8, showing first conveyor.

As shown in FIG. 9, the first conveyor 11 for carrying the holding plate A toward the electrode coater 3 comprises a cart 111 in which several pairs of pulleys 112 are rotatably equipped, a pair of carrier belts 56 driven by the pulleys 112, and a pair of guide rails 57 so as to slidably guide the cart 111. The pulleys 112 are driven by a motor (not shown), and the cart 111 is slidably reciprocated by a drive means (not shown) between the release position 2c of the transferer 2 and a position under the coater 3. Side walls 113 of the cart 111 prevent the holding plate A on the belts 56 from sideward displacement.

Figure 12:
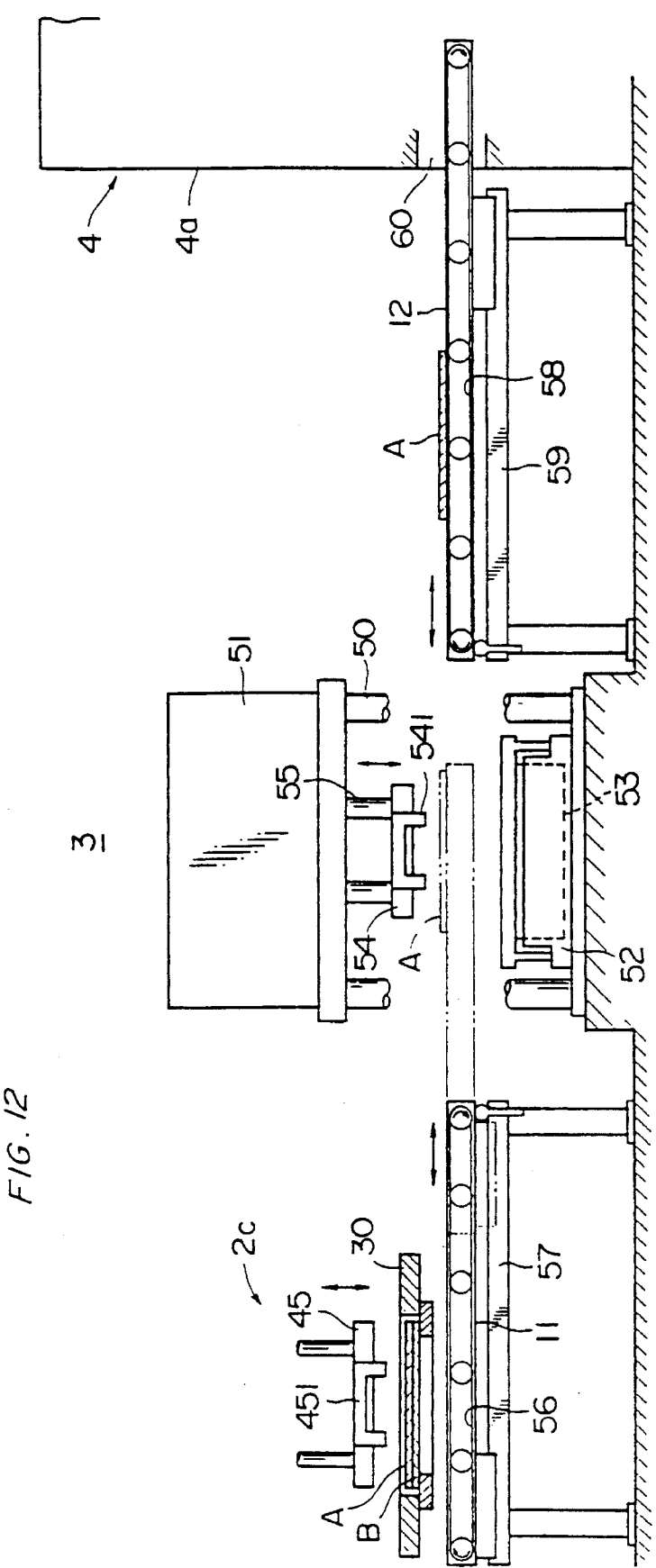
FIG. 12 is a side elevational view showing an electrode coater and first and second conveyors.

As shown in FIG. 12, the electrode coater 3, which is installed next to the release position 2c of the transferer 2, comprises a dip head 51 which is fixedly supported by pillars 50, a vessel 52 which is horizontally placed below the dip head 51, and a blade 53. The dip head 51 is provided with a chucking means 54, which is vertically movably supported by vertical shafts 55 for chucking both side portions of the holding plate A. As shown by two-dot chain lines in FIG. 12, the chucking means 54 can chuck the holding plate A when the conveyor 11 is slidingly moved to the position straightly under the chucking means 54. After the chucking means 54 chucks the holding plate A, the conveyor 11 is retracted to the release position 2c of the transferer 2.

Figure 13:
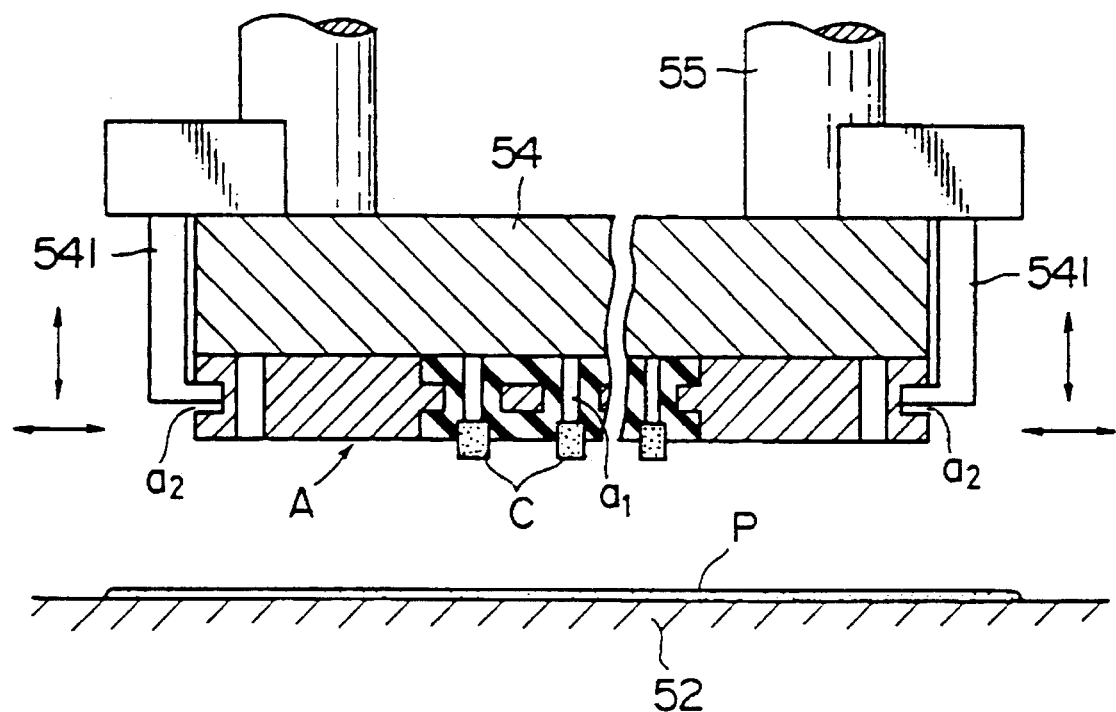
FIG. 13 is a sectional view of the electrode coater for illustrating a method of coating one ends of the chip components with electrode material.

FIG. 13 shows the chucking means 54 holding the holding plate A. The chucking means 54 is provided on both side portions with chucking pawls 541, which are inwardly moved to be engaged with the grooves $a_2$ of the holding plate A and then upwardly moved to press the upper surface of the holding plate A against the lower surface of the chucking means 54. In this way, the holding plate A is fixedly chucked horizontally with one ends of the components C downwardly exposed from the receiving holes thereof.

The vessel 52 is a concave vessel which has a horizontal flat bottom surface, so that the blade 53 is movable with respect to the vessel 52 in a direction perpendicular to the plane of FIG. 12. Since a small clearance is defined between a lower edge of the blade 53 and the bottom surface of the vessel 52, the paste-like electrode material P is supplied on the bottom surface of the vessel 52 in the form of a thin film upon movement of the blade 53, as shown in FIG. 13. Then, the holding plate A holding a number of components C is downwardly moved into the vessel 52, so that the components C are pressed against the bottom surface of the vessel 52. Consequently, widths of the electrodes applied on the ends of the components C become identical to the thicknesses of the material P on the vessel 52. The height of the chucking means 54 from the vessel 52 is adequately adjusted so that the lower surface of the holding plate A will not adhere to the electrode material P.

Even if the ends of the components C exposed from the receiving holes $a_1$ of the holding plate A are dispersed in length, the exposed ends can be corrected to constant lengths when the components C are pressed against the bottom surface of the vessel 52 which is coated with the electrode material P. As a result, the widths of the electrodes applied on the respective components C are substantially identical to each other. The chucking pawls 541, which are engaged with the grooves $a_1$ provided at the side surfaces of the holding plate A, will not interfere with the vessel 52 at the time of electrode coating.

After the coating process, the chucking means 54 chucking the holding plate A is upwardly moved, and then the second conveyor 12 horizontally slides toward the position straightly under the chucking means 54. The second conveyor 12, whose structure is similar to that of the first conveyor 11, is provided with a pair of carrier belts 58 for carrying the holding plate A toward the drying furnace 4, while the conveyor 12 itself is slidably guided by a guide rail 59 so as to be horizontally movable. After the chucking means 54 places the holding plate A on the second conveyor 12, the conveyor 12 slides toward the drying furnace 4 for carrying the holding plate A. At this time, the holding plate A which is placed on the conveyor 12 is holding the components C with their electrode-coated ends exposed below.

Figure 14:
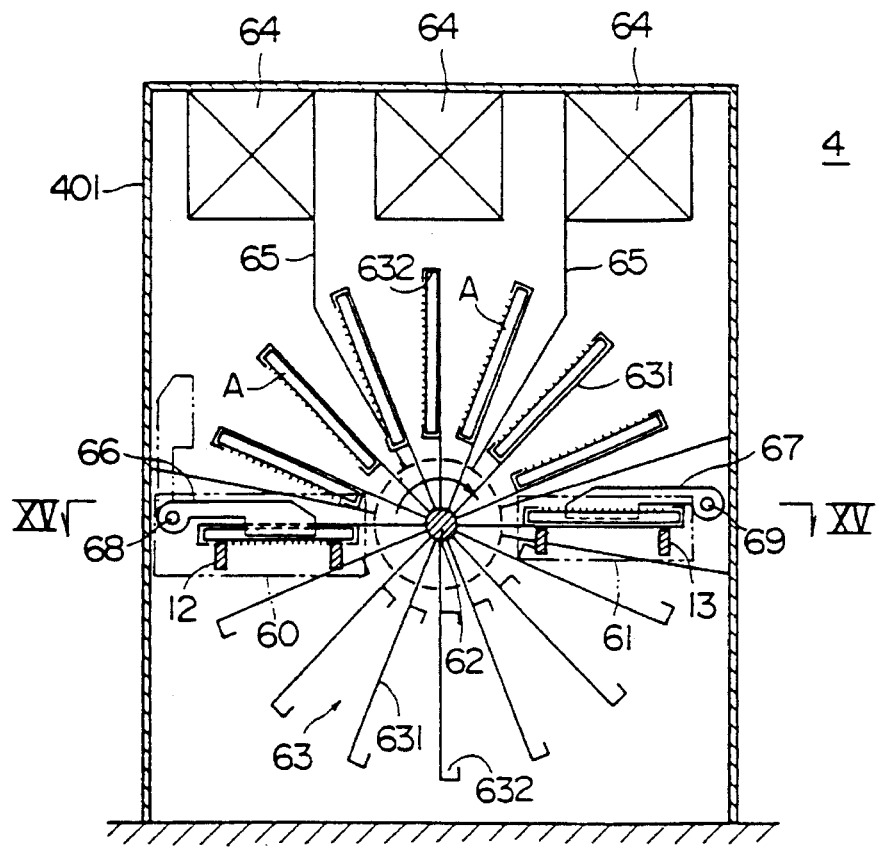
FIG. 14 illustrates an internal structure of a drying furnace.
Figure 15:
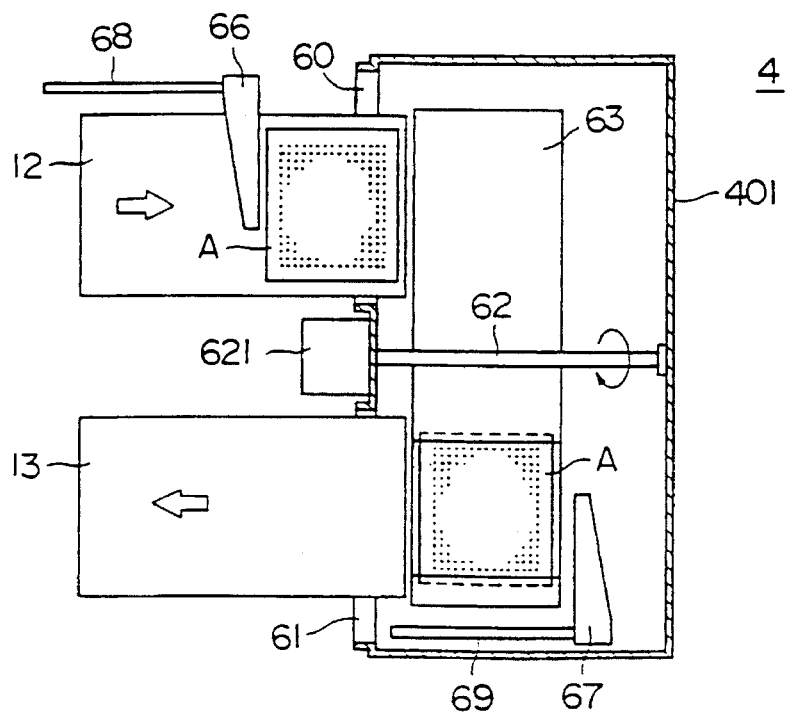
FIG. 15 is a sectional view taken along the line XV—XV in FIG. 14.

As shown in FIGS. 14 and 15, the drying furnace 4 is provided with an furnace body 401 having an inlet opening 60 and an outlet opening 61 on a front surface thereof. The inlet opening 60 receives a forward end portion of the second conveyor 12 and the outlet opening 61 receives a rear end portion of the third conveyor 13. The furnace 4 is further provided in its interior with a horizontal rotary shaft 62 which is intermittently driven by a drive motor 621 along the direction indicated by an arrow, a rotator 63 which is fixed to the rotary shaft 62, a plurality of heaters 64 which are arranged on an upper portion of the drying furnace 4, and partitions 65 dividing the interior of the furnace 4 into a plurality of heating zones. The inlet opening 60 and an outlet opening 61 are formed on 180° symmetrical positions upon the shaft 62. The introducing arm 66 is provided at the inlet opening 60 and an extracting arm 67 is provided at the outlet opening 61. These arms 66 and 67 reciprocate in connection with movement of the conveyors 12 and 13 respectively along shafts 68 and 69, which are arranged in parallel with these conveyors 12 and 13. The arm 66 stays in upwardly rotated position so as to be prevented from interference with the holding plate A when the plate A is conveyed into the furnace 4 by the conveyor 12. When a forward end of the holding plate A is conveyed into the inlet opening 60, the introducing arm 66 is rotated downwardly to a horizontal position along the conveyor 12 so as to push a rear end surface of the holding plate A to insert the plate A into the rotator 63. At this time, it is preferable to drive the conveyor 12 in synchronization with the introducing arm 66, to prevent the holding plate A from unnecessary vibration.

The rotator 63 has a plurality of blades 631 which are fixed radially to the shaft 62 and each of which is provided with a pair of receiving grooves 632 facing each other. The holding plate A which is pushed into the inlet opening 60 by the introducing arm 66 is received horizontally between the receiving grooves 632 of a blade 631 currently stopped at the inlet opening 60. The lower surface of holding plate A, where the electrode coated components are exposed, is open so that the components C are not in contact with the blade 631 and the electrode material is dried effectively.

The rotator 63 is temporarily stopped after every rotation at the same angle as those between each adjacent pair of the blades 631, in other words, the rotator 63 is subjected to the so-called tact movement. The holding plate A held by the blade 631 in the aforementioned manner passes through three heating zones while the rotator 63 is rotated at an angle of 180°, so that the electrode material P coated onto the components C is dried. When the holding plate A reaches the outlet opening 61, the extracting arm 67 waiting in the inner side of the outlet opening 61 pushes an end of the holding plate A toward the third conveyor 13. The holding plate A thus transferred onto the third conveyor 13, with the electrode coated ends of the components C exposed on its upper surface, is now carried to a rack 70.

Figure 16:
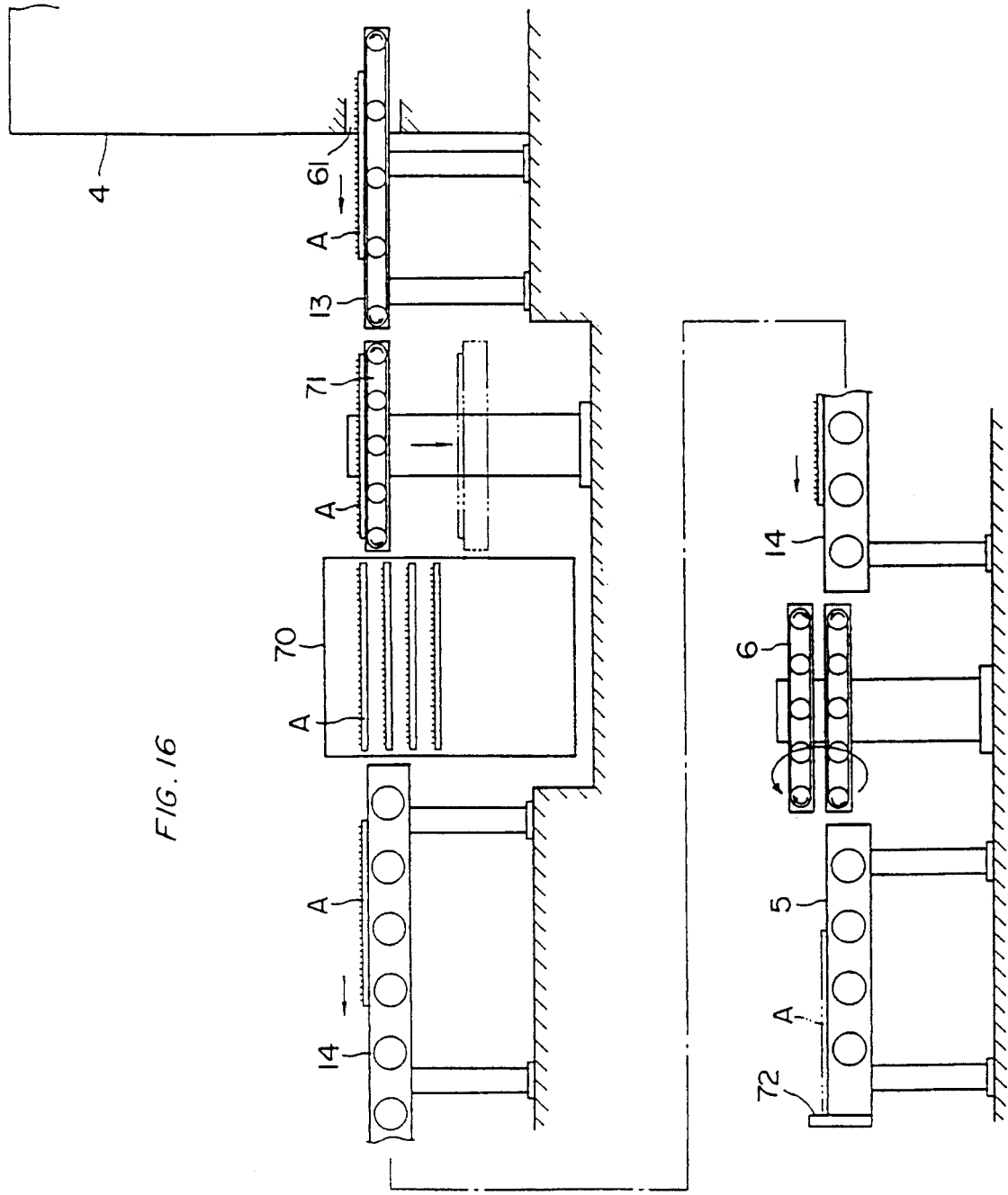
FIG. 16 is a side elevational view showing a portion from a third conveyor to a standby section.

As shown in FIG. 16, an elevator conveyor 71 being vertically movable is arranged between the third conveyor 13 and the rack 70. The holding plate A is transferred onto the conveyor 71, which in turn is downwardly moved to introduce the holding plate A into each shelf of the rack 70. The rack 70 has a vertically moving mechanism (not shown), so that holding plates A stored therein are fed to the fourth conveyor 14 successively from the one placed on the uppermost shelf, to be carried to the holding plate standby section 5. The fourth conveyor 14 is formed of a free flow conveyor on which the holding plates A, being pushed by the following ones, are conveyed forward. The standby section 5 is also formed of a free flow conveyor. The rack 70, being capable of storing a sufficient number of holding plates A for one lot, prevents the holding plates A after the drying process from overflowing on the conveyors. Since the fourth conveyor 14 carries the holding plates A holding the components C exposed upwardly on the upper surfaces thereof, it is easy to check the result of the electrode formation.

As shown in FIG. 16, the inversion conveyor 6 is arranged at a position immediately in front of the holding plate standby section 5. When a holding plate A, in which the chip components C with the electrodes on both ends are held upwardly, is conveyed onto this conveyor 6, the holding plate A is inverted at an angle of 180°. By this inversion, it becomes easy to discharge the components C at the following discharge step. However, when a holding plate A, in which the chip components C with the electrodes on one ends are held upwardly, is conveyed onto this conveyor 6, the holding plate A is passed through without inversion. The holding plate A, which is conveyed by the inversion conveyor 6, is then stopped by a stopper 72 which is provided in the standby section 5.

Figure 17:
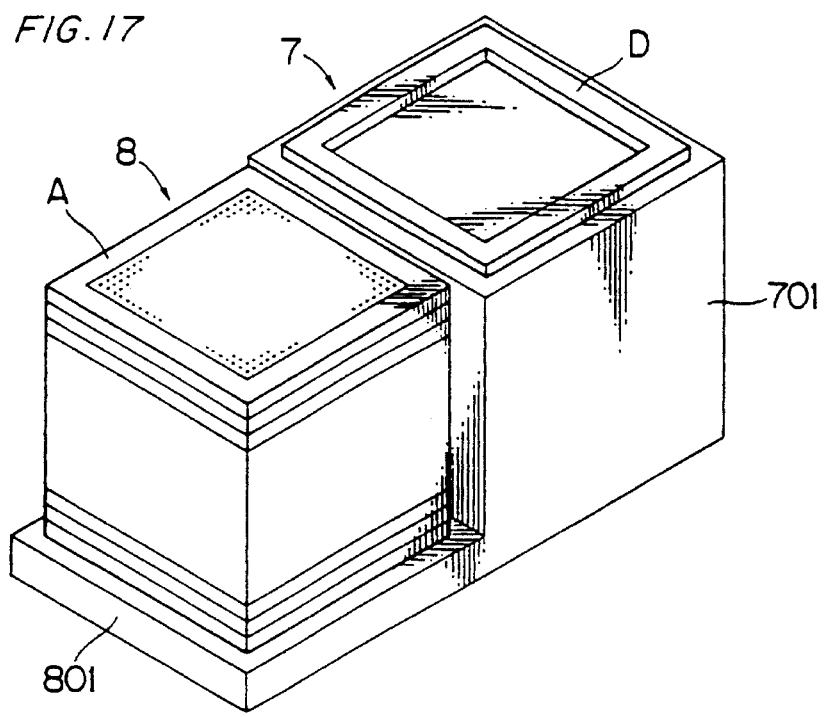
FIG. 17 is a perspective view showing a holding plate storage section and a spacer storage section.

As shown in FIG. 17, the spacer storage section 7 and the holding plate storage section 8 are provided adjacently to each other. These storage sections 7 and 8 have stages 701 and 801 respectively which are different in height from each other. The spacer D is placed on the stage 701, while a number of holding plates A for one lot (25 plates, for example) are superposed on the stage 801.

Figure 18:
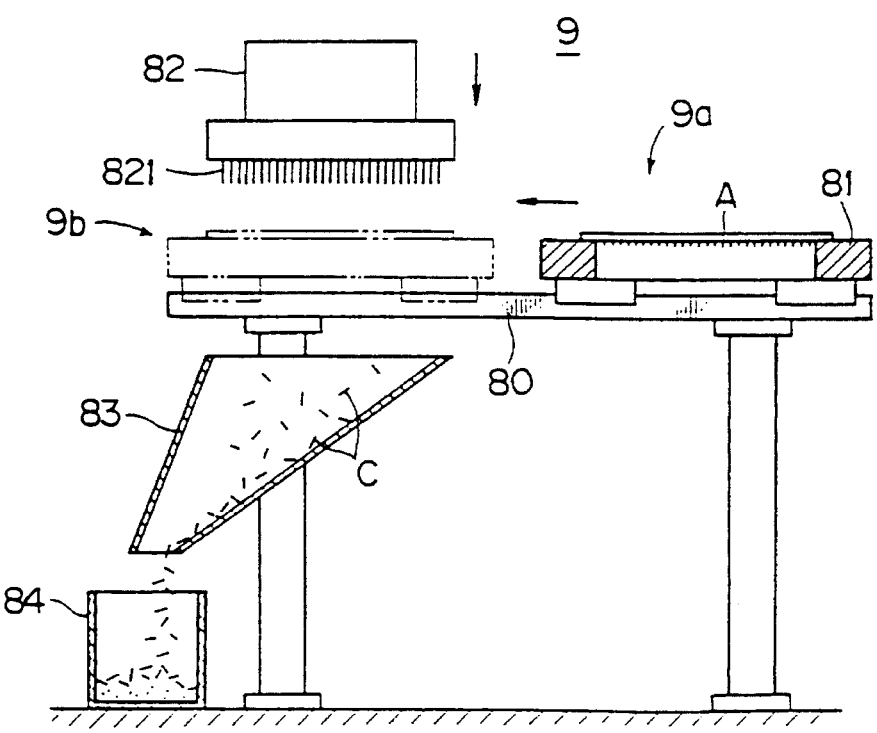
FIG. 18 is a partially fragmented side elevational view showing a discharger.

The discharger 9, which is adapted to discharge the chip components C held by the holding plate A, comprises two positions, i.e., the set position 9a and a press position 9b, as shown in FIG. 18. A pair of guide rails 80 are provided between the set and press positions 9a and 9b, and a frame-like movable table 81 is slidably guided on these rails 80. The holding plate A, downwardly holding the chip components C, is placed on the table 81 by the robot 10, and then carried to the press position 9b by this table 81. A vertically movable pin head 82 is arranged above the press position 9b, while a shooter 83 and a storage box 84 are arranged therebelow. The pin head 82 has a number of press pins 821 which project downwardly therefrom and which correspond to the receiving holes $a_1$. When the holding plate A reaches the press position 9b, the pin head 82 is downwardly moved so that press pins 821 are inserted in the receiving holes $a_1$ to downwardly push out the chip components C into the storage box 84 through the shooter 83. Thus, the storage box 84 stores the chip components C which are coated with the electrode material on both ends.

Operations of the electrode forming system of the aforementioned embodiment are now described.

Figure 19:
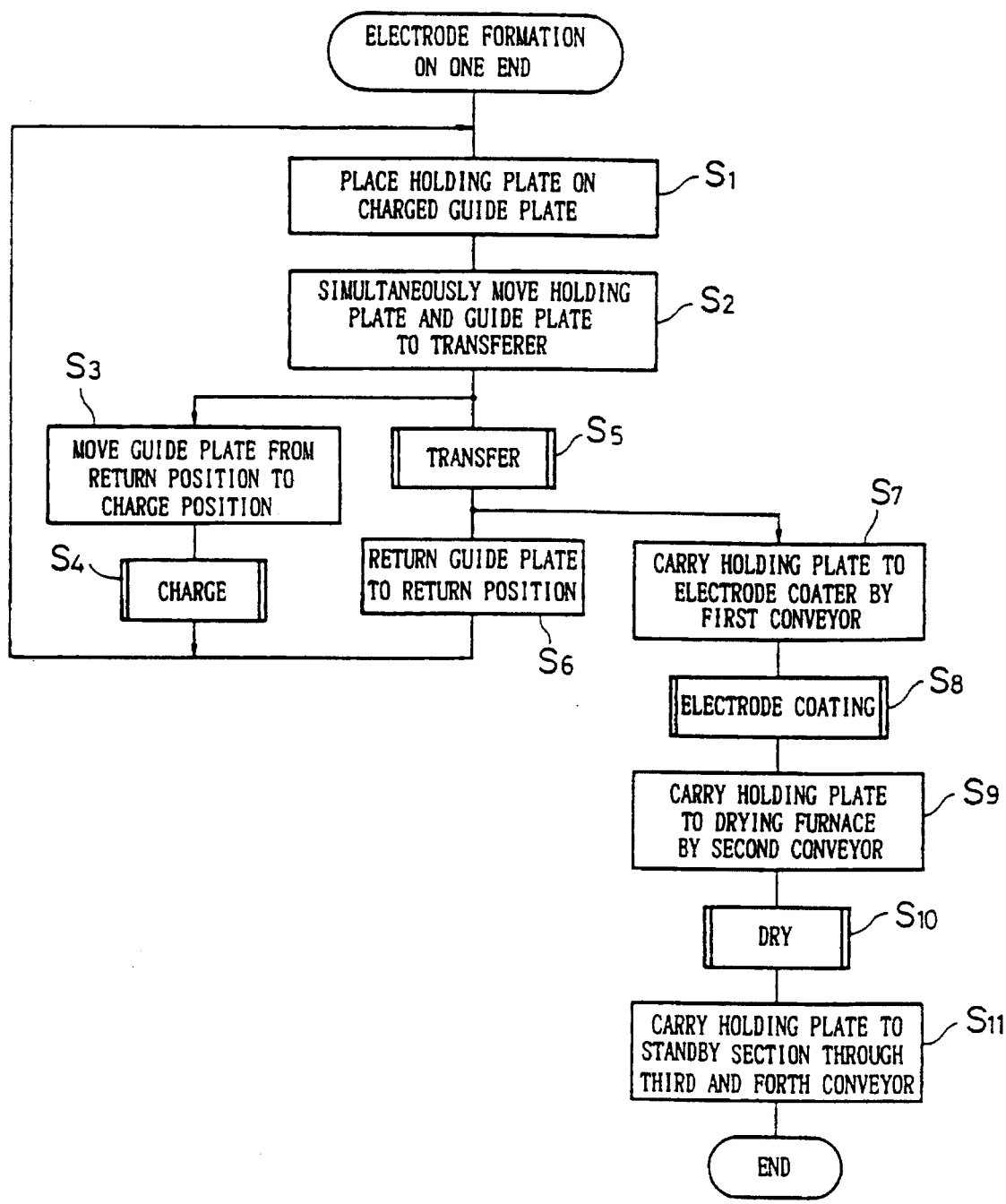
FIG. 19 is a flow chart showing an operation for forming electrodes on one ends of the chip components.

First, processes from charging to drying the chip components C for forming electrodes on one ends thereof are explained with reference to FIG. 19. In these processes, two guide plates B are employed.

A holding plate A is placed on a first guide plate B charged with the chip components C in the charge position 1b (step $S_1$). This holding plate A has been carried to the charge position 1b from the holding plate storage section 8 by the robot 10. Then, the guide plate B and the holding plate A are simultaneously handled by the robot 10, to be carried to the set position 2a of the transferer 2 (step $S_2$)

Thereafter, a second guide plate B which is located on the return position 1a is moved to the charge position 1b by the pusher 21 (step $S_3$), to be charged with chip components C by the charger 1 (step $S_4$). On the other hand, the first guide plate B and the holding plate A at the set position 2a are carried to the press position 2b of the transferer 2, where the chip components C are transferred from the first guide plate B to the holding plate A as shown in FIGS. 10A and 10B (step $S_5$), while the robot 10 waits at the set position 2a. Thereafter, the holding plate A is moved onto the first conveyor 11 by the chucking means 45, so that only the vacated first guide plate B is returned to the set position 2a and handled by the robot 10 to be carried to the return position 1a of the charger 1 (step $S_6$). In this way, the two guide plates B are used in order to repeat the operations of the steps $S_1$ to $S_6$ until only the last holding plate A is left in the holding plate storage section 8. Thus, it is possible to carry out the charging process and the transferring process simultaneously by using two guide plates B in rotation, thereby a high degree of efficiency is attained.

Although only one holding plate A is left in the section 8 in the aforementioned operation, a plurality of holding plates A may be left in the section 8.

After the transferring process is carried out in the transferer 2, the holding plates A downwardly holding the chip components C are carried to the electrode coater 3 by the first conveyor 11 (step $S_7$). Then, the exposed ends of the chip components C are coated with the electrode material P, as shown in FIG. 13 (step $S_8$). Thereafter, the holding plates A are carried to the drying furnace 4 by the second conveyor 12 (step $S_9$), to be subjected to drying process (step $S_{10}$). The holding plates A upwardly holding the components C with as-dried electrodes are carried to the standby section 5 through the third conveyor 13, the fourth conveyor 14 and the inversion conveyor 6 (step $S_{11}$). At this time, the holding plates A are not inverted by the inversion conveyor 6. Those of the holding plates A which cannot be placed on the conveyors 13 and 14 and the standby section 5 are stored in the rack 70.

Figure 20:
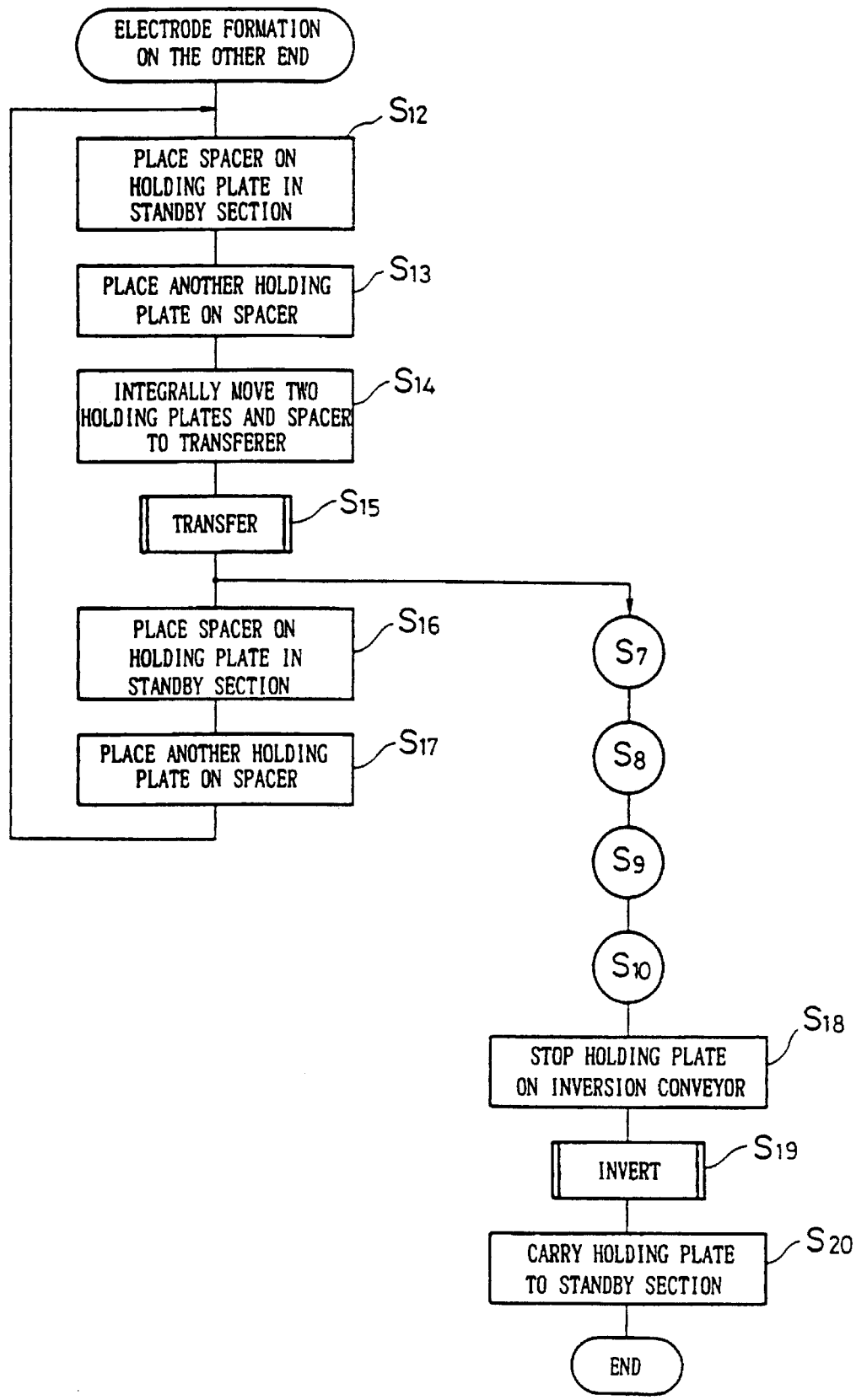
FIG. 20 is a flow chart showing an operation for forming electrodes on the other ends of the chip components.

Next, processes from transferring to drying the chip components C for forming electrodes on the other ends thereof are explained with reference to FIG. 20.

After the first-coming holding plate A reaches the standby section 5, the robot 10 brings the spacer D from the spacer storage section 7 onto the first-coming holding plate A (step $S_{12}$), and brings the holding plate A' which is left in the holding plate storage section 8 onto the spacer D (step $S_{13}$). The robot 10 integrally carries the holding plates A and A' and the spacer D to the set position 2a of the transferer 2 (step $S_{14}$). Thereafter, the transferer 2 carries out the transferring process shown in FIGS. 11A and 11B (step $S_{15}$), while the robot 10 waits at the set position 2a. Thereafter, the upper holding plate A' is moved onto the first conveyor 11 by the chucking means 45, while the spacer D and the vacated holding plate A are returned to the set position 2a. Then, the robot 10 brings the spacer D from the set position 2a onto a next-coming holding plate A waiting at the standby section 5 (step $S_{16}$). Also, the robot 10 brings the vacated holding plate A from the set position 2a onto the spacer D (step $S_{17}$). Thereafter, the operations of the steps $S_{12}$ to $S_{17}$ are repeated. The holding plates A are thus used in rotation in those steps, whereby the number of the holding plates A can be reduced.

The holding plates A downwardly holding the components C at the transferring process $S_{15}$ are carried on to the inversion conveyor 6 through the processes similar to those of steps $S_7$ to $S_{10}$. Each of the holding plates A, carried out from the furnace 4 upwardly holding the components C, is stopped at the inversion conveyor 6 (step $S_{18}$), and inverted at an angle of 180° (step $S_{19}$), so that the components C are exposed downwardly below the holding plate A. Thereafter the holding plate A is carried to the standby section 5 (step $S_{20}$).

Process for discharging the chip components C which are provided on both ends with electrodes from the holding plate A is now described with reference to FIG. 21.

The holding plate A reaching the standby section 5 is carried by the robot 10 to the set position 9a of the discharger 9, to be placed on the movable table 81 (step $S_{21}$). The movable table 81 receiving the holding plate A slides to the press position 9b, in order to discharge the chip components C (step $S_{22}$). The pin head 82 is moved down to push the chip components C which are held in the receiving holes $a_1$, thereby discharging the components C in the storage box 84 through the shooter 83. The vacated holding plate A is returned to the set position 9a by the movable table 81, and then returned to the holding plate storage section 8 by the robot 10 (step $S_{23}$). Thereafter, similar operations are repeated until the holding plates A for one lot are completely processed.

The present invention is not restricted to the aforementioned embodiment, but various modifications are available within the scope of the present invention, as a matter of course.

While the transferer 2 upwardly presses the press pins 36 from below, for example, the press pins 36 may alternatively be downwardly pressed from above. In this case, however, it is necessary to invert the holding plate A before the plate A is moved from the transferer 2 to the electrode coater 3.

The transport means is not restricted to a robot 10 which swings at a constant position, but may alternatively be formed by a self-advancing robot. When the robot is provided with an inversion mechanism, it is possible to omit the inversion conveyor 6.

When capacities of the rack 70 and the storage section 8 for storing the holding plates A are increased, it is possible to process a larger number of holding plates A, as a matter of course.

The drying furnace 4 is not restricted to a 180° rotation type, but may be formed by a 360° rotation type furnace.

The small diameter portions $b_3$ provided on the lower portions of the guide holes $b_1$ of the guide plate B for receiving the press pins 36 may alternatively be formed by through holes which are similar to those described in U.S. Pat. No. 4,395,184. In the case of the present embodiment described above, however, it is not necessary to support the lower side of the guide plate with the holding plate in charging.

The spacer plate D is not restricted to a frame having an opening $d_1$ which is larger than a holes-distributed range of the holding plate A, but may be a plate having a number of through holes which correspond to the receiving holes $a_1$ and each of which has a cross-sectional size sufficiently large to be easily passed through by one of the components C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one ends of said chip components held by said first holding plate with electrode material and for coating the other ends of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said holding plate standby means;

transport means for transport of at least one of said guide plates, said first and second holding plates, and said spacer among said charge means, said transfer means, said discharge means and said holding plate standby means; and control means for controlling said transport means; wherein said transfer means has a number of uprightly directed press pins corresponding to said receiving holes of said holding plates, wherein said press pins upwardly pushes said chip components from said guide holes into said receiving holes of said first holding plate a distance sufficient to have one end of said chip components exposed at a lower surface of said first holding plate when said first plate is superposed on said guide plate, and wherein said press pins upwardly push said chip components from an upper surface of said first plate into said receiving holes of said second holding plate a distance sufficient to have the other end of said chip components exposed at a lower surface of said second holding plate when said second holding plate is superposed on said first holding plate with said spacer therebetween.

2. An electrode forming system in accordance with claim 1, wherein each of said guide holes is provided with a large diameter portion opening at an upper surface of said guide plate and having a cross-sectional size sufficiently large to receive one of said chip components, and a small diameter portion extending from a bottom of said large diameter portion to a lower surface of said guide plate and having a cross-sectional size which is smaller than a cross-sectional size of each of said chip components and which is large enough to be passed through by one of said press pins of said transfer means.

3. An electrode forming system in accordance with claim 1, wherein said first and second holding plates and said guide plate are provided on both side surfaces thereof with plane-directional grooves.

4. An electrode forming system in accordance with claim 1, wherein said first and second holding plates and said guide plate are each provided with pin holes positioned in the vicinity of the edges of said holding plates and said guide plate, said pin holes in said first and second holding plates extending in the direction of said receiving holes, and said pin holes in said guide plate extending in the direction of said guide holes.

5. An electrode forming system in accordance with claim 1, wherein said transport means is a robot swinging at a certain position comprising a hand for handling said first and second holding plates, said guide plate and said spacer, and wherein said charge means, said transfer means, said discharge means and said holding plate standby means are arranged within a working area of said hand of said robot.

6. An electrode forming system in accordance with claim 1, wherein said electrode coating means has a vessel supplied with electrode material on its bottom surface in the form of a thin film, and a chucking means vertically moved while horizontally chucking said holding plates with said chip components downwardly exposed therebelow, and said chucking means presses exposed ends of said chip components against said bottom surface of said vessel, thereby coating said exposed ends with said electrode material.

7. An electrode forming system in accordance with claim 1, wherein said discharge means has a number of downwardly projecting press pins corresponding to said downwardly projecting receiving holes of said second holding plate, and wherein said press pins are inserted in said receiving holes of said second holding plate for downwardly pushing out said chip components.

8. An electrode forming system in accordance with claim 1, wherein said drying means comprises:

a furnace body;

a rotator rotatably mounted on a shaft in said furnace body;

a plurality of receiving means provided at regular angles along the direction of rotation of said rotator for receiving said holding plates;

drive means for intermittently rotating and stopping said rotator at a pitch interval corresponding to an angle between each adjacent pair of said receiving means;

heating means provided in said furnace body for heating said chip components held by said holding plates;

an inlet and an outlet provided on said furnace body facing at least one stopping position of each of said receiving means;

introducing means for introducing said holding plates into said receiving means through said inlet; and extracting means for extracting said holding plates being held by said receiving means from said furnace body through said outlet.

9. An electrode forming system in accordance with claim 8, wherein relative to said rotator's shaft said outlet being located at a position approximately 180-degrees displaced from said inlet, and said electrode material coated on said chip components held by said holding plates are dried during a 180-degree rotation of said rotator.

10. An electrode forming system in accordance with claim 1, wherein said conveyor means comprises:

a first conveyor for carrying said holding plates from said transfer means to said electrode coating means;

a second conveyor for carrying said holding plates from said electrode coating means to said drying means; and a third conveyor for carrying said holding plates from said drying means to said holding plate standby means.

11. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one ends of said chip components held by said first holding plate with electrode material and for coating the other ends of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said holding plate standby means;

transport means for transport of at least one of said guide plates, said first and second holding plates, and said spacer among said charge means, said transfer means, said discharge means and said holding plate standby means; and control means for controlling said transport means;

wherein said transfer means comprises:

a vertically movable support frame having an opening larger than an area of said holding plates encompassing said number of receiving holes;

a pin head being fixedly arranged below said support frame and having said press pins directed uprightly;

a vertically movable backing plate arranged above said support frame having a horizontal lower surface;

said backing plate pushes an upper surface of said first holding plate in order to downwardly move said first holding plate in said guide plate integrally with said support frame, and said press pins upwardly push said chip components from said guide holes into said receiving holes of said first holding plate a distance sufficient to have one ends of said chip component exposed at a lower surface of said first holding plate when said first plate and said guide plate are superposed on said support frame, and said backing plate pushes an upper surface of said second holding plate in order to downwardly move said second holding plate, said spacer and said first holding plate integrally with the support frame, and said press pins upwardly push said chip components from the upper surface of said first plate into said receiving holes of said second holding plate a distance sufficient to have the other ends of said chip components exposed at a lower surface of said second holding plate when said first and second holding plates and said spacer are superposed on said support frame.

12. An electrode forming system in accordance with claim 11, wherein said spacer being in the form of a frame having a thickness less than the length of each of said chip components and having an opening larger than the area which encompass said number of receiving holes in each of said first and second holding plates.

13. An electrode forming system in accordance with claim 12, further comprising:

a spacer storage means for storing said spacer; and a holding plate storage means for storing a number of said first and second holding plates.

14. An electrode forming system in accordance with claim 13, wherein said transport means is a robot swinging at a certain position comprising a hand for handling said first and second holding plates, said guide plate and said spacer, and wherein said charge means, said transfer means, said discharge means, said holding plate standby means, said spacer storage means and said holding plate storage means are arranged within a working area of said hand of said robot.

15. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one ends of said chip components held by said first holding plate with electrode material and for coating the other ends of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said holding plate standby means;

transport means for transport among said charge means, said transfer means, said discharge means and said holding plate standby means; and control means for controlling said transport means;

wherein said first and second holding plates and said guide plate are provided with plane-directional grooves on both side surfaces thereof, and with pin holes proximate both side surfaces, said pin holes in said holding plates extending in the direction of said receiving holes, and said pin holes in said guide plate extending in the direction of said guide holes, and said transport means having a hand, said hand including chucking pawls engageable with said plane-directional grooves, locating pins received in said pin holes, and suction pads capable of vacuum-sucking said spacer.

16. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one ends of said chip components held by said first holding plate with electrode material and for coating the other ends of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said holding plate standby means;

transport means for transport among said charge means, said transfer means, said discharge means and said holding plate standby means; and control means for controlling said transport means;

wherein said conveyor means comprises:

a first conveyor for carrying said holding plates from said transfer means to said electrode coating means;

a second conveyor for carrying said holding plates from said electrode coating means to said drying means; and a third conveyor for carrying said holding plates from said drying means to said holding plate standby means; and wherein said third conveyor comprises inversion means for inverting each of said holding plates.

17. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means for transferring said chip components from said guide plate into said first holding plate and for transferring said chip components from said first plate into said second holding plate;

said transfer means has a number of uprightly directed press pins corresponding to said receiving holes of said holding plates;

said press pins upwardly pushes said chip components from said guide holes into said receiving holes of said first holding plate a distance sufficient to have one end of said chip components exposed at a lower surface of said first holding plate when said first plate is superimposed on said guide plate;

said press pins upwardly pushes said chip components from an upper surface of said first plate into said receiving holes of said second holding plate a distance sufficient to have the other end of said chip components exposed at a lower surface of said second holding plate when said second holding plate is superimposed on said first holding plate with said spacer therebetween;

electrode coating means for coating one end of said chip components held by said first holding plate with electrode material and for coating the other ends of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said holding plate standby means;

transport means for transport of at least one of said guide plate, said first and second holding plates, and said spacer among said charge means, said transfer means, said discharge means and said standby means; and control means for controlling said transport means.

18. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

said transfer means includes a vertically movable support frame for supporting a lower surface of one of said holding plates, a pin head being fixedly arranged below said support frame and having said press pins directed uprightly corresponding to said receiving holes of said holding plates, and a vertically movable backing plate arranged above said support frame having a horizontal lower surface;

said backing plate pushes an upper surface of said first holding plate in order to downwardly move said first holding plate and said guide plate integrally with said support frame, and said press pins upwardly pushes said chip components from said guide holes into said receiving holes of said first holding plate a distance sufficient to have one ends of said chip components exposed at a lower surface of said first holding plate when said first plate and said guide plate are superposed on said support frame;

said backing plate pushes an upper surface of said second holding plate in order to downwardly move said second holding plate, said spacer and said first holding plate integrally with the support framer and said press pins upwardly pushes said chip components from the upper surface of said first plate into said receiving holes of said second holding plate a distance sufficient to have the other ends of said chip components exposed at a lower surface of said second holding plate when said first and second holding plates and said spacer are superposed on said support frame;

electrode coating means for coating one end of said chip components held by said first holding plate with electrode material and for coating the other ends of said chip components held by said second holding plate with electrode material;

drying means for drying said electrode material coated on said chip components;

holding plate standby means for keeping said first and said second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said standby means;

transport means for transport of at lease one of said guide plates, said first and second holding latest and said spacer among said charge means, said transfer means, said discharge means and said standby means; and control means for controlling said transport means.

19. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one ends of said chip components held by said first holding plate with electrode material and for coating the other ends of said chip components held by said second holding plate with electrode material;

drying means for drying said electrode material coated on said chip components;

holding plate standby means for keeping said first and said second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and from said drying means to said standby means;

transport means having a hand for transport of at least one of said guide plates, said first and second holding plates, and said spacer among said charge means, said transfer means, and discharge means and said standby means;

control means for controlling said transport means, said first and second holding plates and said guide plate being provided with plane-directional grooves on both side surfaces thereof, and with pin holes proximate both side surfaces, said pin holes in said holding plates extending in the direction of said receiving holes, and said pin holes in said guide plate extending in the direction of said guide holes; and said hand of said transport means including chucking pawls engageable with said plane-directional grooves, locating pins received in said pin holes, and suction pads capable of vacuum-sucking said spacer.

20. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one end of said chip components held by said first holding plate with electrode material and for coating the other end of said chip components held by said second holding plate with electrode material;

drying means for drying said electrode material coated on said chip components;

holding plate standby means for keeping said first and said second holding plates on standby after being processed by said drying means;

discharge means having a number of press pins corresponding to said receiving holes for discharging said chip components coated with electrodes on both ends from said second holding plate;

a first conveyor for carrying said holding plates from said transfer means to said electrode coating means;

a second conveyor for carrying said holding plates from said electrode coating means to said drying means;

a third conveyor for carrying said holding plates from said drying means to said standby means, said third conveyor includes inversion means for inverting each of said second holding plates;

transport means for transport of at least one of said guide plates, said first and second holding plates, and said spacer among said charge means, said transfer means, said discharge means and said standby means; and control means for controlling said transport means.

21. An electrode forming system for forming electrodes on both ends of chip components, said system comprising:

first and second holding plates having a number of receiving holes for resiliently holding said chip components;

a guide plate having a number of guide holes corresponding to said receiving holes for guiding said chip components;

a spacer for defining a clearance between said first and second holding plates; and transfer means for transferring said chip components from said guide plate into said first holding plate and for transferring said chip components from said first holding plate into said second holding plate;

said transfer means having a number of uprightly directed press pins corresponding to said receiving holes of said holding plates;

said press pins upwardly pushes said chip components from said guide holes into said receiving holes of said first holding plate a distance sufficient to have one end of said chip components exposed at a lower surface of said first holding plate when said first plate is superimposed on said guide plate; and said press pins upwardly push said chip components from an upper surface of said first plate into said receiving holes of said second holding plate a distance sufficient to have the other end of said chip components exposed at a lower surface of said second holding plate when said second holding plate is superimposed on said first holding plate with said spacer therebetween.

22. An electrode forming system for forming electrodes on both ends of chip components, said system comprising:

first and second holding plates having a number of receiving holes for resiliently holding said chip components;

a guide plate having a number of guide holes corresponding to said receiving holes for guiding said chip components;

a spacer for defining a clearance between said first and second holding plates;

transfer means for transferring said chip components from said guide plate into said first holding plate and for transferring said chip components from said first plate into said second holding plate;

said transfer means includes a vertically movable support frame for supporting a lower surface of one of said holding plates, a pin head being fixedly arranged below said support frame and having said press pins directed uprightly corresponding to said receiving holes of said holding plates, and a vertically movable backing plate arranged above said support frame having horizontal lower surface;

said backing plate pushes an upper surface of said first holding plate in order to downwardly move said first holding plate and said guide plate integrally with said support frame, and said press pins upwardly pushes said chip components from said guide holes into said receiving holes of said first holding plate a distance sufficient to have one end of said chip components exposed at a lower surface of said first holding plate when said first plate and said guide plate are superimposed on said support frame; and said backing plate pushes an upper surface of said second holding plate in order to downwardly move said second holding plate, said spacer and said first holding plate integrally with the support frame, and said press pins upwardly pushes said chip components from the upper surface of said first plate into said receiving holes of said second holding plate a distance sufficient to have the other end of said chip components exposed at a lower surface of said second holding plate when said first and second holding plates and said spacer are superimposed on said support frame.

23. An electrode forming system for forming electrodes on both ends of chip components, said system comprising:

first holding plates having a number of receiving holes for resiliently holding said chip components;

a guide plate having a number of guide holes corresponding to said receiving holes for guiding said chip components;

a spacer for defining a clearance between said holding plates; and transport means having a hand for transporting said guide plate, said holding plates and said spacer between processing stages of said system, said holding plates and said guide plate being provided with plane-directional grooves on both side surfaces thereof, and with pin holes proximate both side surfaces, said pin holes in said holding plates extending in the direction of said receiving holes, and said pin holes in said guide plate extending in the direction of said guide holes, and said hand of said transport means including chucking pawls engageable with said plane-directional grooves, locating pins received in said pin holes, and suction pads capable of vacuum-sucking said spacer.

24. An electrode forming system for forming electrodes on both ends of chip components, said system comprising:

first and second holding plates having a number of receiving holes for resiliently holding said chip components;

a guide plate having a number of guide holes corresponding to said receiving holes;

a spacer for defining a clearance between said first and second holding plates;

charge means for charging said chip components into said guide holes of said guide plate;

transfer means having a number of press pins corresponding to said receiving holes, for transferring said chip components from said guide plate into said first holding plate and for transferring said chip components from said first plate into said second holding plate;

electrode coating means for coating one end of said chip components held by said first holding plate with electrode material and for automatically coating the other end of said chip components held by said second holding plate with electrode material;

drying means for drying said electrode material coated on said chip components;

holding plate standby means for keeping said first and second holding plates on standby after being processed by said drying means;

discharge means having a number of press pins corresponding to said receiving holes for discharging said chip components coated with electrodes on both ends from said second holding plate;

conveyor means for carrying said first and second holding plates, said conveyor means having a first conveyor for carrying said holding plates from said transfer means to said electrode coating means, a second conveyor for carrying said holding plates from said electrode coating means to said drying means, and a third conveyor for carrying said holding plates from said drying means to said holding plate standby means, with said third conveyor having inversion means for inverting each of said second holding plates;

transport means for transport of at least one of said guide plates, said first and second holding plates, and said Spacer among said charge means, said transfer means, said discharge means and said holding plate standby means; and control means for controlling said transport means.

25. An electrode forming system for forming electrodes on both ends of chip components, said system comprising:

first and second holding plates having a number of receiving holes for resiliently holding said chip components;

a guide plate having a number of guide holes corresponding to said receiving holes for guiding said chip components;

a spacer for defining a clearance between said first and second holding plates;

charge means for charging said chip components into said guide holes of said guide plate;

transfer means for transferring said chip components from said guide plate into said first holding plate and for transferring said chip components from said first holding plate into said second holding plate;

electrode coating means for coating one end of said chip components held by said first holding plate with electrode material and for coating the other end of said chip components held by said second holding plate with electrode material;

drying means for drying said electrode material coated on said chip components;

standby means for keeping one of said first and second holding plates on standby after being processed by said drying means;

discharge means having a number of press pins corresponding to said receiving holes for discharging said chip components coated with electrodes on both ends from said second holding plate;

conveyor means for carrying said first and second holding plates from said transfer means to said electrode coating means, from said electrode coating means to said drying means and form said drying means to said standby means;

transport means for transport of at least one of said guide plate, said first and second holding plates, and said spacer among said charge means, said transfer means, said discharge means and said standby means;

control means for controlling said transport means, and said charge means said transfer means, said discharge means and said standby means being positioned within a working area of said transport means.

26. An electrode forming system in accordance with claim 25, wherein said transport means has a hand movable in said working area which includes said charge means, said transfer means, said discharge means and said standby means, for handling at least one of said first and second holding plates, said guide plate and said spacer.

* * * * *